United States Patent [19]
Ogoh et al.

[11] Patent Number: 5,323,343
[45] Date of Patent: Jun. 21, 1994

[54] DRAM DEVICE COMPRISING A STACKED TYPE CAPACITOR AND A METHOD OF MANUFACTURING THEREOF

[75] Inventors: Ikuo Ogoh; Masao Nagatomo, both of Hyogo, Japan

[73] Assignee: Mitsubishi Denki Kabushiki Kaisha, Tokyo, Japan

[21] Appl. No.: 77,971

[22] Filed: Jun. 18, 1993

Related U.S. Application Data

[63] Continuation of Ser. No. 764,688, Sep. 24, 1991, abandoned, which is a continuation-in-part of Ser. No. 597,674, Oct. 17, 1990, abandoned.

Foreign Application Priority Data

Oct. 26, 1989 [JP] Japan ............... 1-281409
Sep. 6, 1990 [JP] Japan ............... 2-238790

[51] Int. Cl.⁵ ............................................. G11C 11/24
[52] U.S. Cl. ..................................... 365/149; 257/306
[58] Field of Search ............. 365/149; 357/23.6, 71; 257/306

[56] References Cited

U.S. PATENT DOCUMENTS

| | | | |
|---|---|---|---|
| 4,922,312 | 5/1990 | Coleman et al. | 357/23.6 |
| 5,006,481 | 4/1991 | Chan et al. | 357/23.6 |
| 5,017,982 | 5/1991 | Kobayashi | 357/23.6 |
| 5,063,425 | 11/1991 | Yamauchi et al. | 357/23.6 |
| 5,065,201 | 11/1991 | Yamauchi | 357/23.6 |
| 5,089,192 | 3/1992 | Coleman et al. | 357/23.6 |
| 5,089,869 | 2/1992 | Matsuo et al. | 357/23.6 |
| 5,103,285 | 4/1992 | Furumura et al. | 357/71 |

Primary Examiner—Joseph E. Clawson, Jr.
Attorney, Agent, or Firm—Lowe, Price, LeBlanc & Becker

[57] ABSTRACT

A DRAM according to the present invention comprises a memory cell array having memory cells constituted by one transfer gate transistor (10) and a capacitor (11), and a peripheral circuit having a MOS transistor (45a) with the LDD structure. At least the source/drain region (19) connected to the capacitor of the transfer gate transistor is formed of a low concentration impurity region (19a). The low concentration impurity region has an impurity concentration substantially equal to that of the low concentration source/drain region (31) of the LDD MOS transistor of the peripheral circuit. The low concentration/drain region of the transfer gate transistor is formed by masking the surface thereof at the time of the high concentration ion implantation step for high concentration source/drain formation of the MOS transistor of the peripheral circuit. By omitting the high concentration ion implantation step, the substrate deficiency of the source/drain region of the transfer gate transistor is eliminated to suppress leakage of the charge from the capacitor.

12 Claims, 17 Drawing Sheets

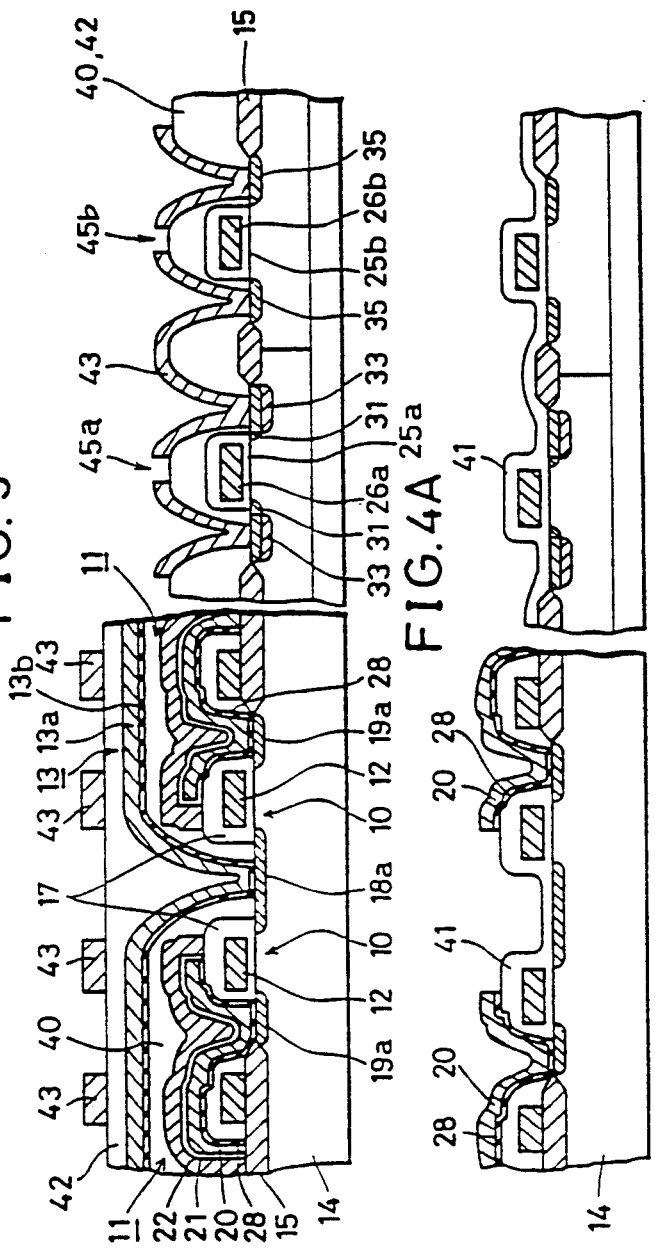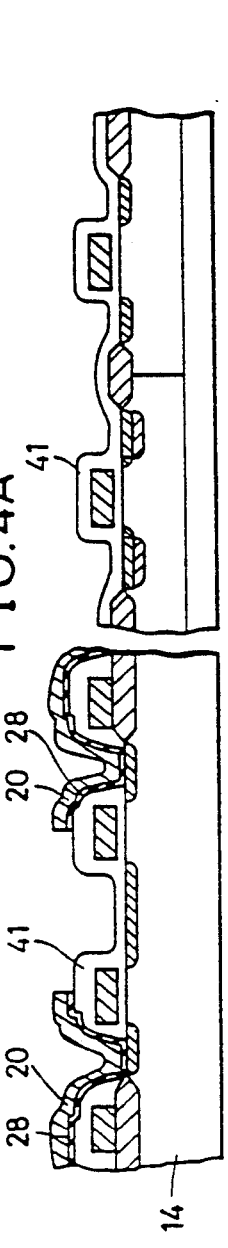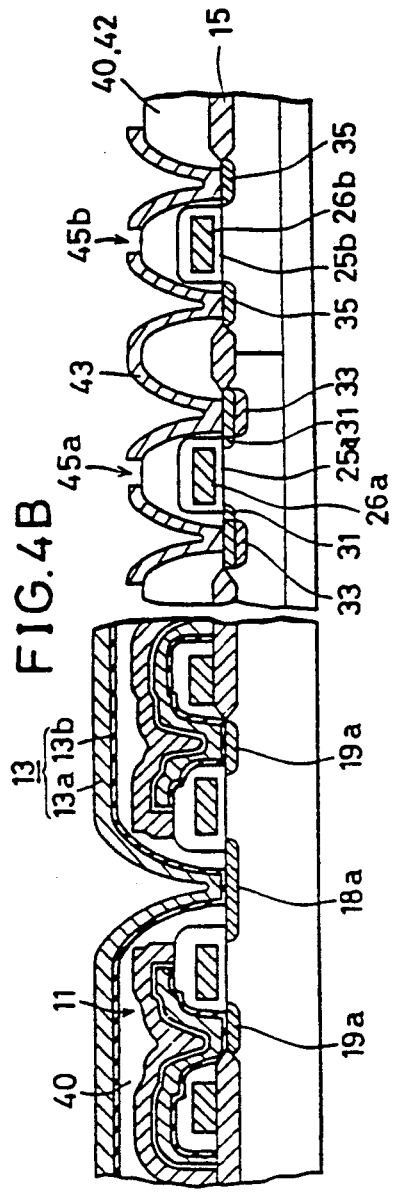

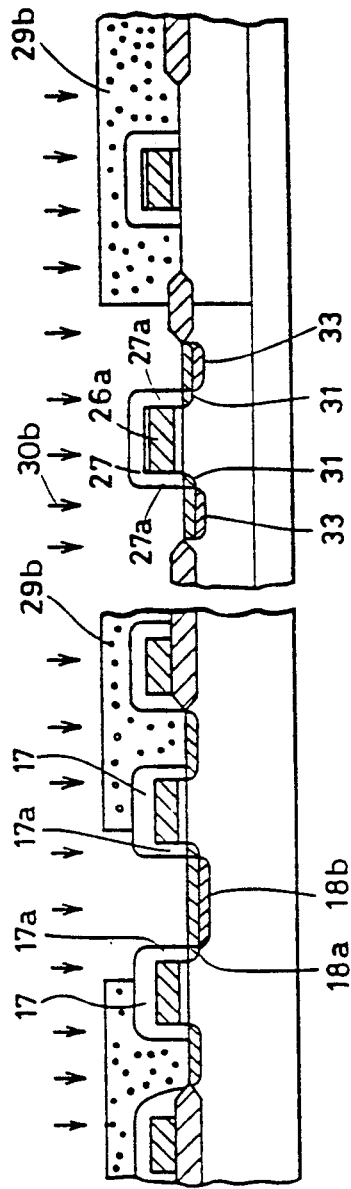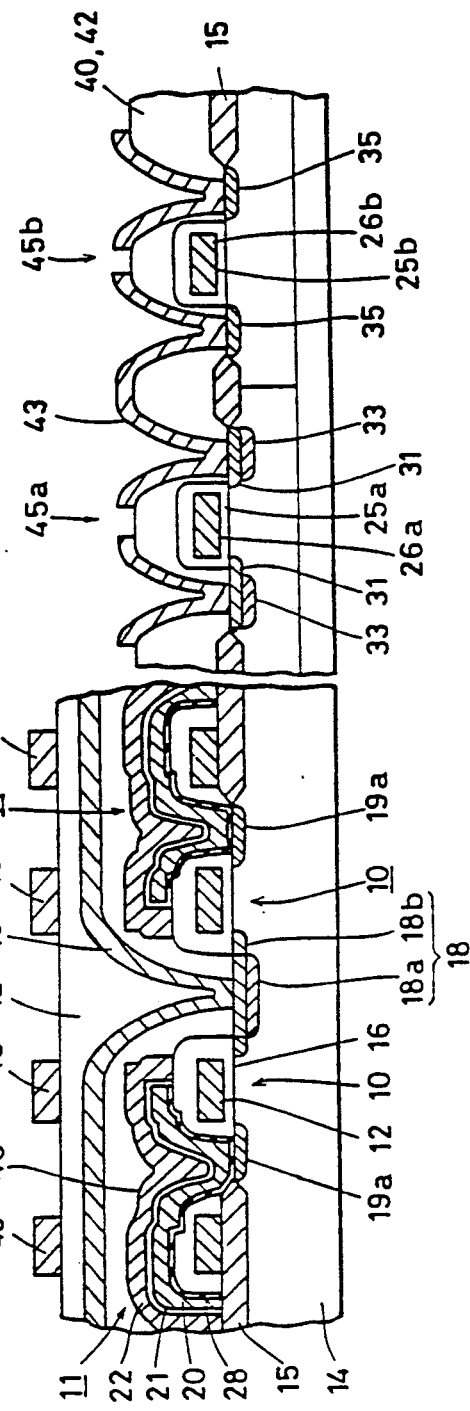

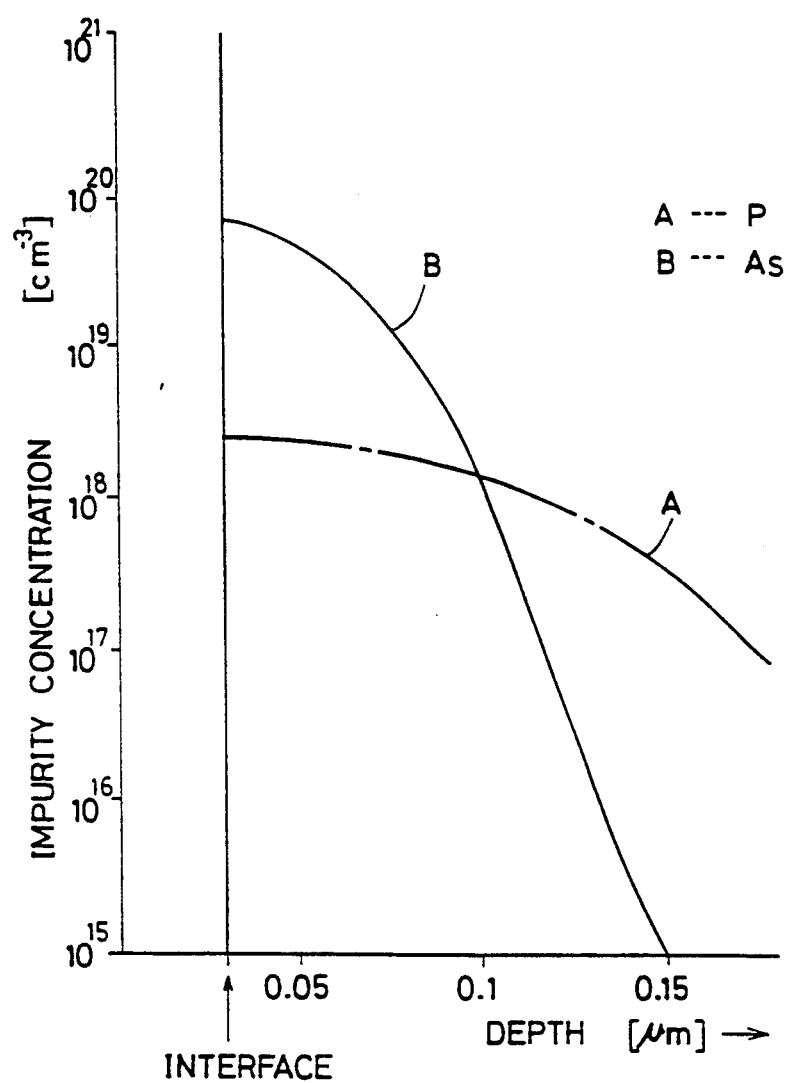

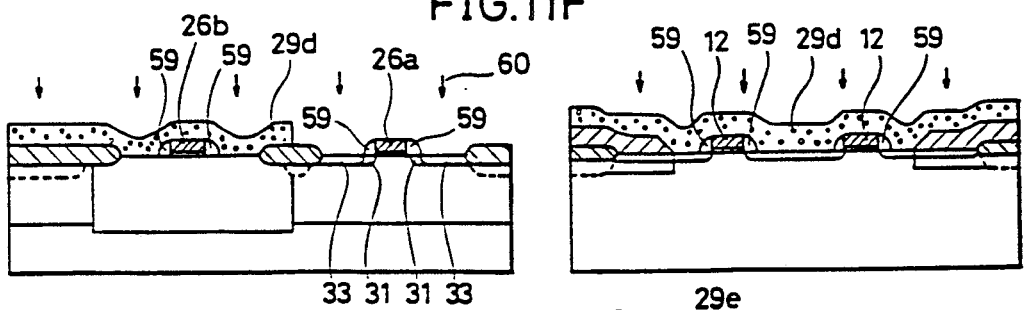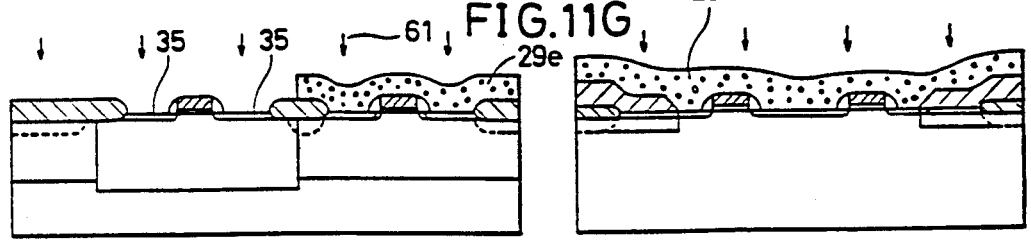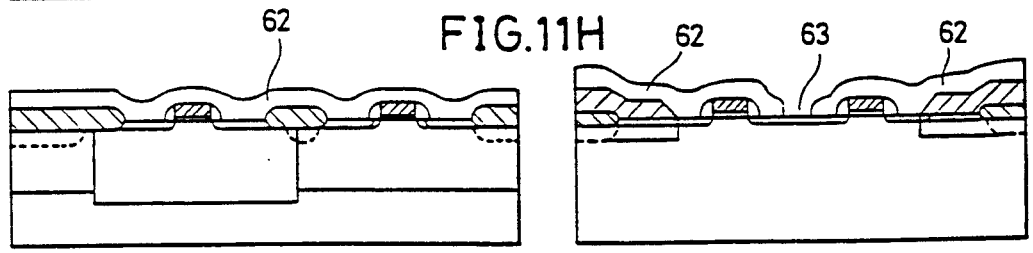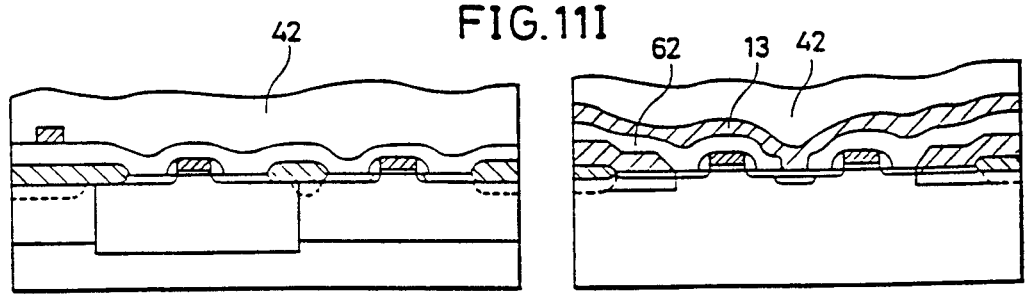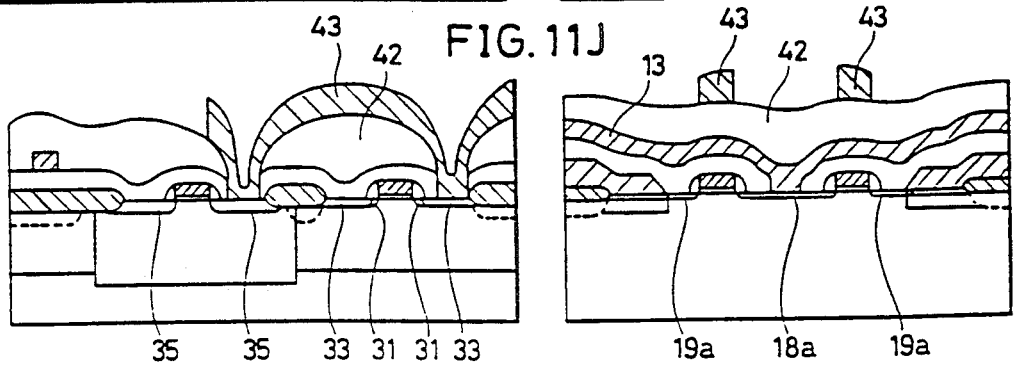

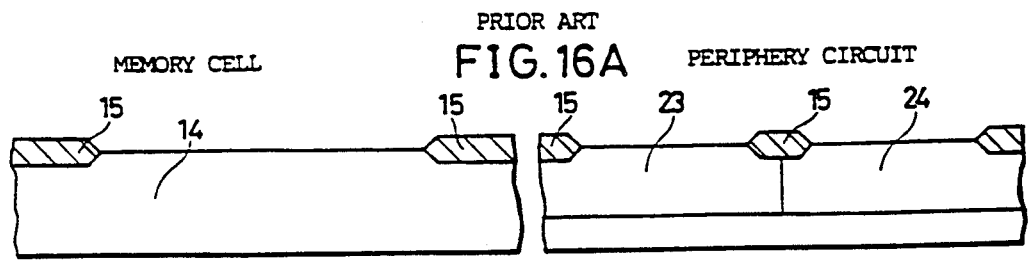
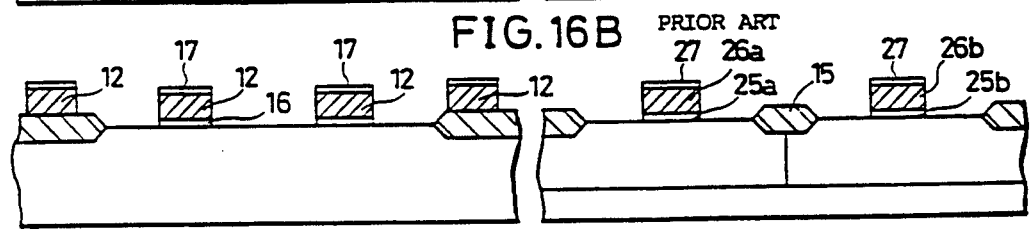
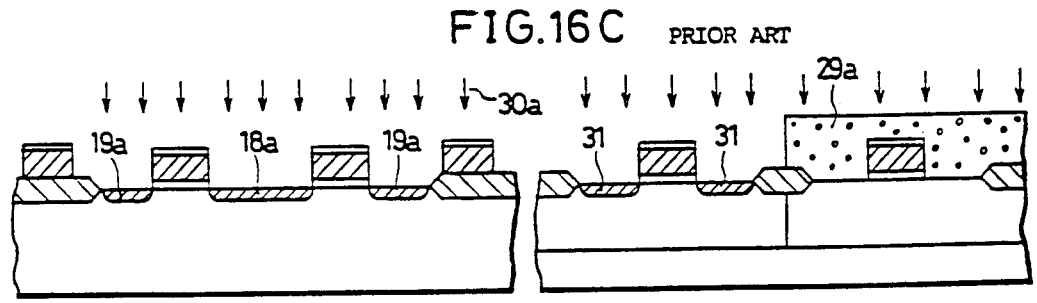
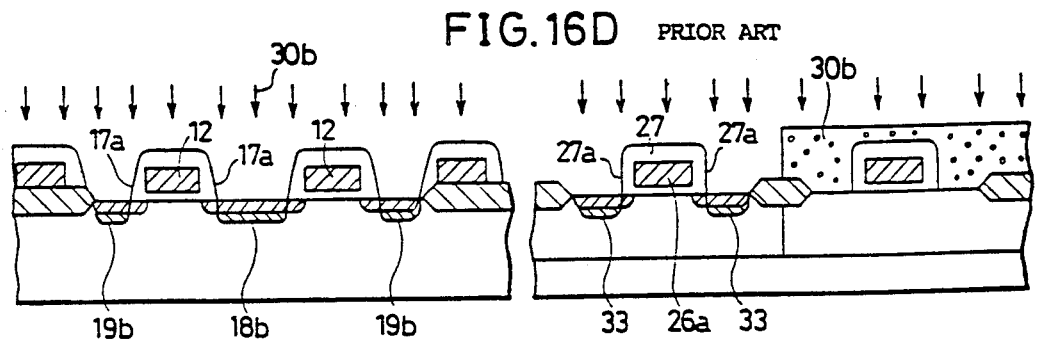
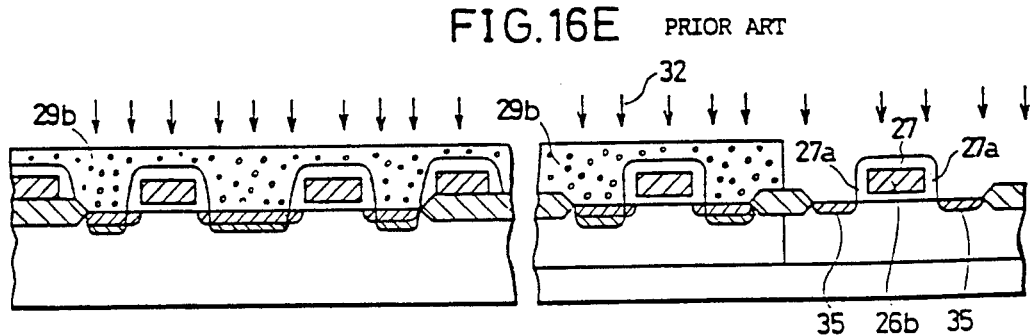

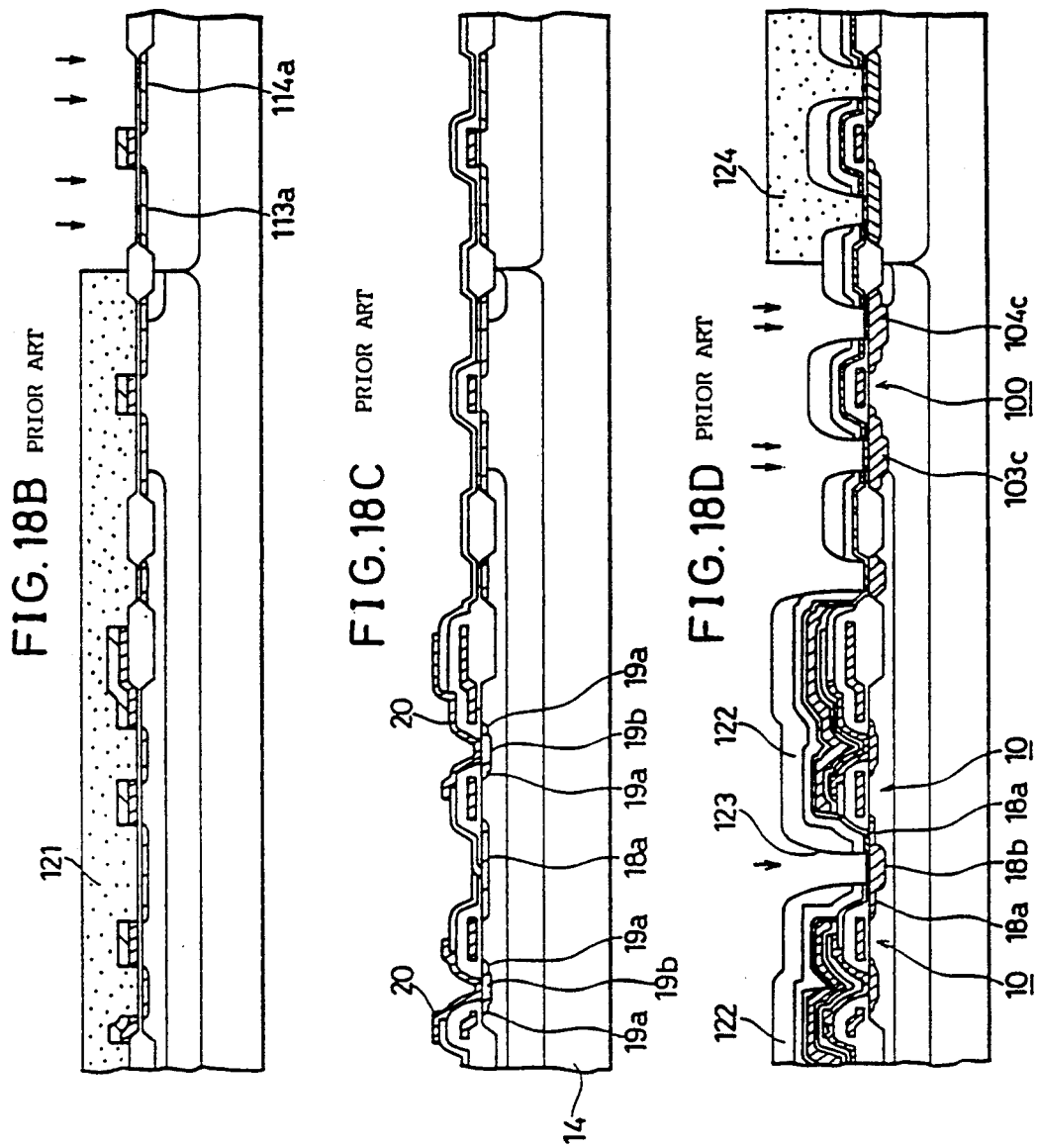

DRAM DEVICE COMPRISING A STACKED TYPE CAPACITOR AND A METHOD OF MANUFACTURING THEREOF

CROSS-REFERENCE TO RELATED APPLICATION

This application is a continuation of Application Ser. No. 07/764,688 filed Sep. 24, 1991, now abandoned, which is a continuation in part of application Ser. No. 07/597,674 filed on Oct. 17, 1990 both abandoned.

FIELD OF THE INVENTION

The present invention relates to DRAMs (Dynamic Random Access Memory), and more particularly, to a DRAM having one-transistor-one-capacitor type memory cell with a structure that can improve the reliability of the storage holding characteristic and a method of manufacturing thereof.

DESCRIPTION OF THE BACKGROUND ART

With reference to the block diagram of FIG. 13, the circuit structure of a general dynamic type semiconductor memory will be explained hereinafter. The DRAM comprises, a memory cell array 1 having a plurality of memory cells storing unit memory information arranged in a matrix manner. It further comprises, as peripheral circuitry, a row-and-column address buffer 2 for receiving externally applied address signals ($A_0$–$A_9$; in case of 1Mbit) for selecting a memory cell, a row decoder 3 and a column decoder 4 for specifying a memory cell by decoding the address signal, a sense refresh amplifier 5 for amplifying and reading out the signal stored in the specified memory cell, a data-in buffer 6 and a data-out buffer 7 for data input/output, and a clock generator 8 for generating clock signals $\Phi 1$ and $\Phi 2$. Clock generator 8 is implemented so as to receive row address strobe signal $\overline{RAS}$ and column address strobe signal $\overline{CAS}$ applied externally.

FIG. 14 is an equivalent circuit diagram of a memory cell forming memory cell array 1. Memory cell 9 is formed of one transfer gate transistor 10 and one capacitor 11. The gate electrode of transfer gate transistor 10 is connected to a word line 12, while one of the source/drain region is connected to a bit line 13, and the other connected to one electrode of a capacitor 11.

The DRAM stores data according to the presence or absence of a signal charge in the capacitor of the memory cell. The determination of the presence or absence of data is made by specifying each word line to select a memory cell, reading out from the bit line a small signal responsive to the presence or absence of a signal charge in the capacitor of the selected memory cell, and amplifying the same by an sense amplifier. The signal charge stored in the memory cell capacitor dissipates due to disturbance such as by leakage currents after some time passes. It will be necessary to update the stored information in each memory cell periodically in order to keep storing the data. The circuit operation for this purpose is called the refresh operation. More specifically, with reference to FIGS. 13 and 14, refresh operation is carried out by amplifying the small signal from the memory cell with a sense amplifier provided corresponding to each bit line, after selecting a word line to activate the memory cells connected to that word line, and returning the same to the memory cell. By executing the above mentioned refresh operation with respect to all word lines changing the row address sequentially, all information within the memory cell array is updated. It is necessary to repeat the refresh operation at a period shorter than the time period in which the signal charge is held in the memory cell. The shorter the hold time of the signal charge is, the greater the number of refresh operations, the so-called refresh division number.

FIG. 15 shows a sectional view of memory cell 9 of FIG. 14. Referring to FIG. 15, a thick field oxide film 15 for device isolation is formed on the surface of a semiconductor substrate 14. On the surface of semiconductor substrate 14 enclosed by field oxide film 15, transfer gate transistor 10 and capacitor 11 are formed.

Transfer gate transistor 10 is provided with a gate electrode (word line) 12 formed above the surface of semiconductor substrate 14 with a gate oxide film 16 therebetween. The circumference of gate electrode 12 is covered by a silicon oxide film 17 for insulation. Particularly, silicon oxide film 17 formed at the sides of gate electrode 12 is implemented with the so-called sidewall structure. Within semiconductor substrate 14, $n^-$ impurity regions 18a and 19a of low concentration are formed in a position self-aligning gate electrode 12. Also, $n^+$ impurity regions 18b and 19b of high concentration are formed at a position self-aligning the sidewalls of silicon oxide film 17. The so-called LDD (Lightly Doped Drain) structure is formed by these $n^-$ impurity regions 18a and 19a and $n+$ impurity regions 18b and 19b. The impurity regions of this LDD structure become source/drain regions 18 and 19.

Capacitor 11 has a stacked structure constituted by a lower electrode 20 having impurities doped, a dielectric film 21 formed by silicon nitride film, silicon oxide film, or a multilayer film such as of silicon nitride film and silicon oxide film, and an upper electrode 22 formed of polysilicon having impurities doped. Capacitor 11 has the lower electrode 20 formed above gate electrode 12 of transfer gate transistor 10. A portion of lower electrode 20 is connected to one $n+$ source/drain region 19b of transfer gate transistor 10. Such a capacitor 11 having a structure in which a portion is formed over transfer gate transistor 10 is called a stacked capacitor, while DRAMs including such capacitors are called stacked type DRAMs.

Although not shown, MOS (Metal Oxide Semiconductor) transistors having the above mentioned LDD structure are used in the peripheral circuit.

The effect of the LDD structure of a MOS transistor will be explained hereinafter. The employment of LDD structure was due to advancement in high integration of DRAMs. The minute structure of MOS transistors associated with the high integration of DRAMs induced short channel effect, resulting in various problems. The electric field intensity in the channel region was increased because of the short channel, to generate hot carriers in the vicinity of the drain. This is trapped within the gate oxide film and generates surface level. This causes deterioration in characteristics such as threshold value voltage change and decrease of mutual conductance. A LDD structure with the $n^-$ impurity region of low concentration and $n^+$ impurity region of high concentration formed offset was proposed to prevent change in characteristics caused by hot carriers. The $n^-$ impurity region of low concentration in the LDD structure decreases the electric field intensity to suppress the generation of hot carriers by reducing the junction grade of the pn junction. It is required that this n− impurity region of low concentration controls the diffusion width and impurity concentration precisely.

With reference to FIGS. 16A–16I, the manufacturing process of a DRAM will be explained. Such a DRAM manufacturing process is shown in Japanese Patent Application Laying-Open 63-44756, for example. For convenience of description, memory cell 9 and the CMOS transistor (complementary MOS: referred to as CMOS hereinafter) implementing a portion of the peripheral circuit is taken as an example.

As shown in FIG. 16A, field oxide film 15 is formed on the surface of semiconductor substrate 14 by LOCOS (Local Oxidation of Silicon) method. In the peripheral circuit region of semiconductor substrate 14, a p well region 23 and a n well region 24 for n channel MOS (referred to as nMOS hereinafter) and p channel MOS (referred to as pMOS hereinafter) formation implementing a CMOS are formed in advance.

As shown in FIG. 16B, a thin silicon oxide film and polysilicon layer are formed in sequence on the surface of semiconductor substrate 14. On the surface of the polysilicon layer, oxide films 17 and 27 are formed. Then, a predetermined shape is patterned using lithography and etching method. Thus, nMOS gate oxide film 16 implementing a memory cell, gate electrode 12, nMOS and pMOS gate oxide films 25a and 25b forming the peripheral circuit, and gate electrodes 26a and 26b are formed.

After a resist 29a covers the pMOS region of the peripheral circuit, phosphorus (P) ions or arsenic (As) ions 30a of low concentration are implanted onto the surface of the substrate. This ion implanting step causes n− impurity regions 18a and 19a of the transfer gate transistor 10 of the memory cell and n− impurity region 31 of the nMOS transistor of the peripheral circuit to be formed.

After an oxide film is deposited all over the substrate, this oxide film is etched anisotropically, as shown in FIG. 16D. This forms sidewalls 17a and 27a of oxide films at the sidewalls of gate electrode 12 of the transfer gate transistor 10 and gate electrode 26a of the peripheral circuit's nMOS transistor.

Using these sidewalls 17 and 27a of oxide film, n impurity ions 30b such as arsenic (As) or phosphorus (P) of high concentration are implanted onto the surface of the substrate. By this ion implantation, n+ impurity regions 18b and 19b of transfer gate transistor 10 and n+ impurity region 33 of the nMOS transistor of the peripheral circuit are formed.

According to the above mentioned steps, the LDD structure of transfer gate transistor 10 of the memory cell and the LDD structure of the nMOS transistor of the peripheral circuit are implemented.

As shown in FIG. 16E, a resist 29b covers the surface of the memory cell and the nMOS transistor region of the peripheral circuit, followed by implanting p type impurity ions 32 of high concentration such as boron (B, BF₂) onto the surface of the substrate through sidewalls 27a of gate electrode 26b. By this ion implanting step, p+ impurity regions 35 and 35 of pMOS transistor are formed. Thus, the pMOS transistor of the peripheral circuit is formed by the above mentioned steps.

Next, the manufacturing steps of capacitor 11 of the memory cell will be explained. As shown in FIG. 16F, after an interlayer film 41 is deposited using CVD (Chemical Vapor Deposition) method on the surface of the substrate in which gate electrodes and the like of the transistor are formed, interlayer film 41 is patterned using lithography and etching method to form a contact region connecting lower electrode 20 of the capacitor with the substrate.

Then, as shown in FIG. 16G, polysilicon is deposited using CVD method. It is necessary to dope n type impurities for polysilicon to possess electrical conductivity. This is implemented by doping with gas such as phosphine (PH₃) at the time of the CVD step, or by implanting and driving-in phosphorus (P) or arsenic (As) using ion implanting method after the deposition of polysilicon or after a predetermined patterning. Then, lower electrode 20 of capacitor 11 is formed by patterning this polysilicon layer.

As shown in FIG. 16H, a capacitor dielectric film 21 formed of silicon nitride film, silicon oxide film, or a composite film of these is formed using the CVD method. A doped polysilicon layer 22 is deposited thereof using CVD method. Then, patterning of a predetermined shape is carried out using photolithography and etching method. Thus, capacitor 11 is formed.

As shown in FIG. 16I, interlayer insulating film 40 is formed above the surface of the substrate where devices such as transistors and capacitors are formed, followed by opening a predetermined region to form bit line 13.

After the formation of a second interlayer insulating film 42, a predetermined region is opened to form a wiring layer 43.

Thus, a DRAM is manufactured comprising a transistor having the LDD structure, in accordance with the above mentioned steps.

As set forth throughout the above description, transfer gate transistor 10 of the memory cell in a conventional DRAM has source/drain regions 18 and 19 of the LDD structure formed by ion implantation. When n+ impurity regions 18b and 19b of high concentration are formed by ion implanting method, many crystal deficiencies are generated on the surface of the semiconductor substrate 14. The crystal deficiencies are recovered to some extent by a later heat processing for activation, but not completely. In the case where lower electrode 20 of capacitor 11 is formed over source/drain region 19 where crystal deficiencies remain, signal charge stored in capacitor 11 passes through the crystal deficiencies within source/drain region 19 flowing to the substrate side to generate leakage currents. Due to the reduction in capacitor capacitance associated with the miniaturization of the device structure in recent years, the disappearance of signal charge by leakage currents from the capacitor became a large problem. Therefore, the hold time of signal charge stored in memory cells becomes shorter, leading to problems such as the need to increase the number of refresh operations.

There was also a problem of poor contact between substrate 14 and bit line 13 or lower electrode 20 of capacitor 11. This was ascribed to multiple oxidization of incidental oxide film by impurity effect, generated on the surface of semiconductor substrate 14 where impurity regions 18b and 19b of high concentration are formed, caused by air entering the CUD chamber when the semiconductor is introduced into the chamber.

An approach to suppress the occurrence of leakage currents from the capacitor is shown in Japanese Patent Laying-Open No. 64-80065. FIG. 17 is a sectional structure view of the DRAM shown in the above mentioned laid-open application. Referring to FIG. 17, a sectional structure of a memory cell array and the peripheral circuit devices are shown. On p type silicon substrate 14, p well region 14a and n well region 14b are formed.

The memory cell array and nMOS transistor 100 of the peripheral circuit are formed in p well region 14a, whereas pMOS transistor 110 is formed in n well region 14b. The memory cell constituting the memory cell array is constructed of one transfer gate transistor 10 and one capacitor 11, similar to the memory cell of FIG. 15. Comparing the structures of the second conventional memory cell of FIG. 17 and the first conventional memory cell of FIG. 15, the transfer gate transistor 10 of the second conventional memory cell has the so-called LDD structure with n⁻ impurity region 19a of low concentration formed by ion implantation of source/drain region 19 of the side connected to capacitor 11 and n⁺ impurity region 19b of high concentration formed by impurity heat diffusion from lower electrode 20 of capacitor 11. The source/drain region 18 of the side connected to bit line 13 has the LDD structure with n⁻ impurity region 18a of low concentration formed by ion implantation and n⁺ impurity region 18b of high concentration formed also by ion implantation. The transfer gate transistor 10 of this example suppresses the generation of crystal deficiency in the surface of the substrate by ion implantation to decrease the generation of leakage currents from the capacitor, by forming high concentration impurity region 19b without using the ion implantation method over source/drain region 19 of the side connected to the capacitor.

Bit line 13 is constituted by a three layer structure stacking a barrier metal layer 13a, an aluminum layer 13b, and a protection film 13c in sequence. Barrier metal layer 13a is formed of a refractory metal silicide layer, such as $MoSi_2$ or the like and a refractory metal layer to prevent monocrystal silicon from being precipitated in the contact between aluminum layer 13b and source/drain region 18.

On the right hand of FIG. 17, a sectional structure view of a CMOS implementing the peripheral circuit is shown. The nMOS transistor 100 of the CMOS is constructed of a gate insulating film 101, a gate electrode 102, and a pair of source/drain regions 103 and 104. Each of source/drain regions 103 and 104 have a LDD structure formed of n⁻ impurity regions 103a and 104a of low concentration and n⁺ impurity regions 103b and 104b of high concentration. On source/drain regions 103 and 104, n⁺ impurity regions 103c and 104c are formed. The n impurity regions 103c and 104c are provided for the purpose of preventing source/drain regions 103 and 104 from shorting with wiring layers 105 and 105.

The pMOS transistor 110 of the CMOS is implemented by a gate insulating film 111, a gate electrode 112, and a pair of source/drain regions 113 and 114. Each of source/drain regions 113 and 114 has a LDD structure with p impurity regions 113a and 114a of low concentration and p⁺ impurity regions 113b and 114b of high concentration.

The main steps of manufacturing the source/drain region of the transfer gate transistor of the memory cell, which is a feature of the conventional example will be explained hereinafter. FIGS. 18A-18D are sectional views illustrating the main manufacturing steps of the DRAM of FIG. 17.

FIG. 18A shows the ion implanting steps for forming sources/drains of transfer gate transistor 10 of the memory cell and nMOS transistor 100 of the peripheral circuit. Referring to FIG. 18A, a resist 120 covers the formation region of pMOS transistor 110, followed by ion implantation of phosphorus (P) or arsenic (As) under the conditions of dosage of $10^{13}/cm^2$, and implant energy of 60–120 keV. This results in the formation of n impurity regions 18a and 19a of low concentration of transfer gate transistor 10 and n impurity regions 103a and 104a of nMOS transistor 100.

Referring to FIG. 18B, resist 120 is removed, and resist 121 covers the memory cell array and nMOS transistor 100 formation region of the peripheral circuit. Then, ion implantation of $BF_2$ or B is carried out onto p type semiconductor substrate 14 with a dosage of $10^{13}/cm^2$ and implant energy of 60–100 keV. This results in the formation of p impurity regions 113a and 114a of low concentration of pMOS transistor 110.

With reference to FIG. 18C, the formation step of high concentration impurity region of transfer gate transistor 10 will be described hereinafter. On the surface of n⁻ impurity region 19a of transfer gate transistor 10, lower electrode 20 of capacitor 11 is formed. Ion implantation of arsenic or phosphorus is carried out onto lower electrode 20 of capacitor 11 with a dosage of $10^{153}/cm^2$ and implant energy of 75–85 keV. Then, the n type impurities introduced into lower electrode 20 are diffused to the surface of p type silicon substrate 14 by heat processing. This diffusion step causes n⁺ impurity region 19b of high concentration of source/drain region 19 to be formed.

FIG. 18D shows the formation step of the high concentration region of source/drain region 18 of the transfer gate transistor. In the memory cell array, interlayer insulating layer 122 is formed above the memory cell. Interlayer insulating layer 122 has a contact hole 123 formed contacting source/drain region 18 of transfer gate transistor 10. Under this state, resist 124 covers the formation region of pMOS transistor 110 of the peripheral circuit. Then, arsenic ions are implanted into the surface of p type silicon substrate 14 at a dosage of $10^{15}/cm^2$ and implant energy of 110–130 keV. This results in the formation of n⁺ impurity region 18b of high concentration of source/drain region 18 of transfer gate transistor 10. Simultaneously, n⁺ impurity regions 103c and 104c of high concentration are formed in nMOS transistor 100 of the peripheral circuit.

Thus, in the second conventional DRAM, the source/drain region 19 of the side connected to the capacitor of transfer gate transistor 10 is constituted by a LDD structure with n⁻ impurity region 19a of low concentration by ion implantation and n⁺ impurity region 19b of high concentration by heat diffusion. The source/drain region 18 of the side connected to bit line 13 is implemented by a LDD structure with n⁻ impurity region 18a of low concentration also by ion implantation and n⁺ impurity region 18b of high concentration also by ion implantation.

In the above mentioned second conventional example, a method is proposed where high concentration region of source/drain region of the transfer gate transistor is formed by heat diffusion from the lower electrode of the capacitor, for the purpose of suppressing the generation of leakage currents from the capacitor caused by deficiency of the surface of the substrate due to high concentration ion implantation. However, the deleterious effect of high temperature heat processing becomes significant in proportion to the increase of the DRAM's stored capacitance such as to 16 Mb or 64 Mb, and is not preferable. That is to say, miniaturization in the structure of a memory cell array is required to increase the integration density of DRAMs. As a result, the channel length of transfer gate transistor 10 of the memory cell is minimized. If source/drain regions 18 and 19 are formed using heating process of high temperature, as in the above-mentioned second conventional embodiment, under such circumstances impurities are diffused into the channel region of transfer gate transistor 10 which results in significant short channel effect. This short channel effect will cause deterioration in the characteristics of the transistor, such as reduction in reliability lifetime of transfer gate transistor 10. Therefore, the recent technical developments in the manufacturing methods of DRAMs are carried out to shift from high temperature processes to low temperature processes. The conventional method of forming a source/drain region of high concentration in a transfer gate transistor by thermal diffusion causes short channel effect in the MOS transistor of a DRAM to impede increase in integration density of a DRAM.

In the second conventional example, n+ impurity region 18b of high concentration is formed by ion implantation on the source/drain region 18 of the side connected to the bit line. This promotes the generation of incidental oxide film as stated before, leading to a problem of preventing efficient ohmic contact between the bit line and source/drain region 18.

SUMMARY OF THE INVENTION

An object of the present invention is to improve the refresh characteristic of the memory cell in a DRAM.

Another object of the present invention is to suppress leakage of stored charge generated between the capacitor and the source/drain of the transfer gate transistor in the memory cell of a DRAM.

A further object of the present invention is to reduce contact resistance of the bit line contact of a DRAM.

A still further object of the present invention is to provide a method of manufacturing a DRAM suppressing the crystal deficiencies of the source/drain region of the transfer gate transistor of a memory cell.

In accordance with an aspect of the present invention, a DRAM comprises a memory cell array having a plurality of memory cells storing unit unit memory information, and a peripheral circuit for writing/reading operation of a predetermined stored information with respect to the memory cell array on the main surface of the semiconductor substrate. The memory cell is formed in the vicinity of the intersection of a plurality of word lines extending on the main surface of the semiconductor substrate, and a plurality of bit lines extending in a direction crossing the word lines, comprising a transfer gate transistor with a first impurity region formed in the semiconductor substrate connected to the bit line and a gate electrode connected to the word line, and a capacitor connected to a second impurity region of the transfer gate transistor. The peripheral circuit comprises a transistor of a conductivity type identical to that of the transfer gate transistor, having a pair of impurity regions constituted by a region of relatively high concentration and a region of relatively low concentration each formed in the surface of the semiconductor substrate, and a gate electrode formed on the surface of the semiconductor substrate with an insulating film therebetween. Of the impurity region pair of the transfer gate of the memory cell, at least the impurity concentration of the second impurity region connected to the capacitor is set to be substantially equal to the impurity concentration of the impurity region of relatively low concentration of the transistor of the peripheral circuit.

In accordance with a second aspect of the present invention, both of the impurity region pair of the transfer gate transistor of the memory cell of the DRAM have an impurity concentration substantially equal to the concentration of the impurity region of relatively low concentration of the transistor of the peripheral circuit.

In accordance with a third aspect of the present invention, the second impurity region connected to the capacitor of the transfer gate transistor of the memory cell of the DRAM is implemented with a region having an impurity concentration substantially equal to that of the impurity region of relatively low concentration of the transistor of the peripheral circuit. The first impurity region connected to the bit line is implemented with a first region having an impurity region substantially equal to that of the impurity region of relatively low concentration of the transistor of the peripheral circuit and a second region having a concentration higher than that of the first region.

In accordance with a fourth aspect of the present invention, of the pair of impurity regions of the transfer gate transistor of the memory cell of the DRAM, at least the second impurity region connected to the capacitor comprises a region having an impurity concentration substantially equal to that of the impurity region of relatively low concentration of the transistor of the peripheral circuit in the inner peripheral region along the pn junction plane between the semiconductor substrate and the impurity region.

In accordance with a fifth aspect of the present invention, both of the impurity regions of the transfer gate transistor of the memory cell of the DRAM comprise a region having an impurity concentration substantially equal to that of the impurity region of relatively low concentration of the transistor of the peripheral circuit in the inner peripheral region along the pn junction plane between the semiconductor substrate and the impurity region.

In accordance with a sixth aspect of the present invention, the second impurity region connected to the capacitor of the transfer gate transistor of the memory cell comprises a region having an impurity concentration substantially equal to that of the impurity region of relatively low concentration of the transistor of the peripheral circuit in the inner peripheral region along the pn junction plane between the semiconductor substrate and the impurity region. The first impurity region connected to the bit line is constituted by a first region having an impurity concentration substantially equal to that of the impurity region of relatively low concentration of the transistor of the peripheral circuit, and a second region having a concentration higher than that of the first region.

In accordance with the seventh aspect of the present invention, a method of manufacturing a DRAM comprises the following steps for manufacturing a DRPM having a first transistor including an impurity region of one concentration and a second transistor including an impurity region of double diffusion structure with two different concentrations formed on the same semiconductor substrate.

First, a gate electrode of the first transistor and a gate electrode of the second transistor are formed on the main surface of the semiconductor substrate with a gate insulating film therebetween.

Impurity ions are implanted onto the semiconductor substrate using the gate electrodes as a mask, to simultaneously formed an impurity region of relatively low concentration of the second transistor and an impurity region of the first transistor having an impurity concentration equal to that of the impurity region of low concentration. Then, the surface of the region of the first transistor is coated, followed by implanting impurity ions onto the semiconductor substrate using the gate electrode of the second transistor as a mask, to form an impurity region of relatively high concentration of the second transistor.

In accordance with a eighth aspect of the present invention, a method of forming a semiconductor device comprises the following steps, relative to a semiconductor device having a memory cell array and a peripheral circuit on the same semiconductor substrate, wherein the memory cell of the memory cell array includes a first MOS transistor, and a capacitor and the bit line each connected to the pair of impurity regions of the first MOS transistor, and wherein the peripheral circuit includes a second MOS transistor of a conductivity type identical to that of the first MOS transistor.

First, a gate electrode of the first MOS transistor and a gate electrode of the second MOS transistor are formed on the main surface of the semiconductor substrate with an insulating layer therebetween.

Then, impurity ions are implanted onto the main surface of the semiconductor substrate using the gate electrodes of the first and second MOS transistors as a mask to form a low concentration impurity region of the first MOS transistor and a low concentration impurity region of the second MOS transistor. After the surface of the first MOS transistor is coated, impurity ions are implanted into the semiconductor substrate using the gate electrode of the second MOS transistor as a mask to form a high concentration impurity region of the second MOS transistor. On one low concentration impurity region of the first MOS transistor, a first conductive layer, a dielectric layer, and a second conductive layer of the capacitor are formed in sequence. On the surface of the first MOS transistor, an interlayer insulating layer is formed having an opening through to the other low concentration impurity region of the first MOS transistor. Above the interlayer insulating layer and in the opening, a bit line constituted by a conductive layer including impurities is formed.

In the present invention, the impurity regions of the transfer gate transistor implementing the memory cell are formed without ion implantation of high concentration. One such method is to form the impurity region of the transfer gate transistor consisting of an impurity region of low concentration. An alternative method is to form the impurity region of the transfer gate transistor comprising an impurity region of low concentration and a high concentration region formed by thermally diffusing impurities of high concentration included in the conductive layer connected to the impurity region of low concentration into the substrate. This high concentration region formed by thermal diffusion is held within the impurity region of low concentration. This eliminates crystal deficiencies generated on the semiconductor substrate due to ion implantation for high concentration impurity region formation, to suppress leakage of signal charge stored in the capacitor. Furthermore, the hold time of signal charge of the capacitor will become longer to improve the characteristic of the refresh operation of the memory cell. Also, the generation of incidental oxide film due to multiple effect of impurities included in the semiconductor substrate is suppressed. Accordingly, the contact between the impurity regions of the transfer gate transistor and the bit line or the lower electrode of the capacitor is improved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a sectional structure view of the DRAM according to a second embodiment of the present invention.

FIGS. 4A and 4B are sectional views of the DRAM of FIG. 3 at different main manufacturing steps thereof.

FIG. 7 is a sectional view of the DRAM of FIG. 6 at different main manufacturing steps thereof.

FIG. 8 is a sectional structure view of a modification of the DRAM of the fourth embodiment of the present invention.

FIG. 9 is a concentration profile showing the result of simulating the concentration distribution of the impurity region of the transfer gate transistor of DRAM of FIG. 1.

FIGS. 11A-11J are sectional views of the DRAM of FIG. 10 at different manufacturing steps thereof.

FIGS. 16A-16I are sectional views showing the conventional DRAM of FIG. 15 at different manufacturing steps thereof.

FIGS. 18A-18D are sectional views showing the DRAM of FIG. 17 at different main manufacturing steps thereof.

DESCRIPTION OF THE PREFERRED EMBODIMENTS

Figure 1:
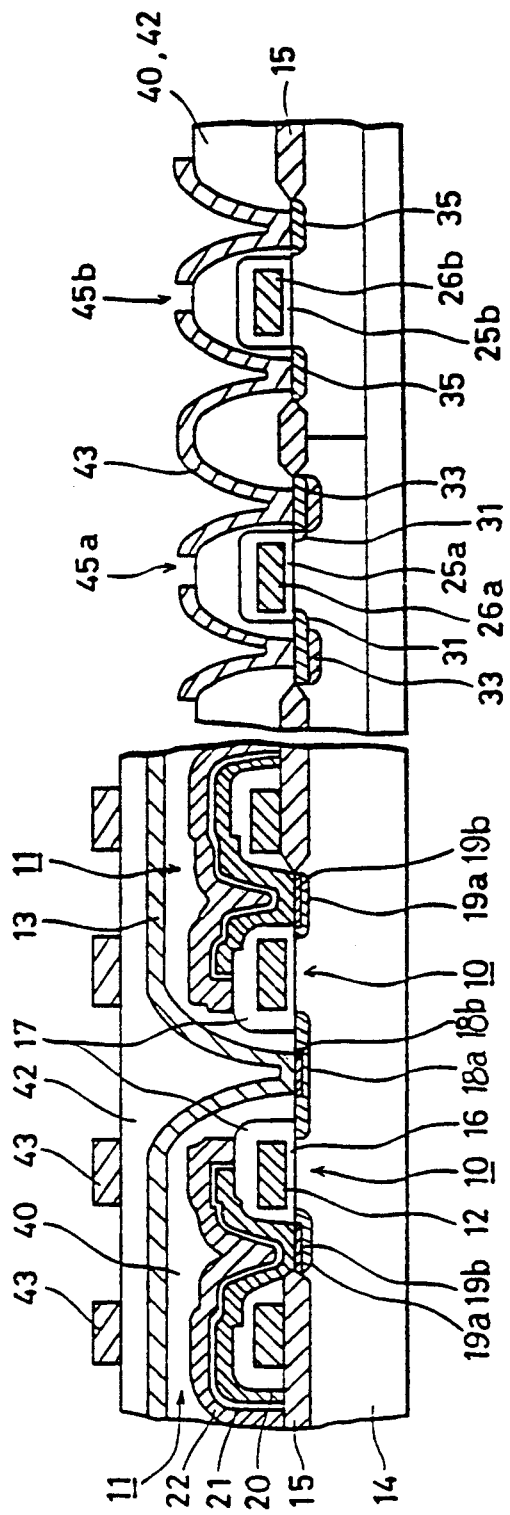
FIG. 1 is a sectional structure view of a DRAM according to a first embodiment of the present invention.

Referring to FIG. 1, a memory cell of a DRAM according to a first embodiment of the present invention is constituted by one transfer gate transistor 10 and one capacitor 11 connected thereto. Transfer gate transistor 10 comprises a gate electrode (word line) formed of polysilicon doped by phosphorus (P) on the surface of the p type semiconductor substrate 14 with gate oxide film 16 therebetween. The circumference of gate electrode 12 is covered by oxide film 17. In semiconductor substrate 14, there are provided a pair of $n^-$ impurity regions 18a and 19a of low concentration formed self-aligned with gate electrode 12, and n+ impurity regions 18b and 19b of high concentration formed inside n− impurity regions 18a and 19a.

Capacitor 11 has a stacked structure of lower electrode 20, dielectric film 21, and an upper electrode 22. The formation region of the capacitor has a structure extending over to the upper portion of field oxide film 15 from above gate electrode 12 of transfer gate transistor. Lower electrode 22 is formed of polysilicon having phosphorus or arsenic implanted, or of the so-called doped polysilicon having phosphorus or arsenic doped at the time of CVD formation. Dielectric film 21 of the capacitor is formed of silicon nitride film, with a thin oxide film on the surface of the silicon nitride film, although not shown. This oxide film does not have to be necessarily formed. Upper electrode 22 is formed using a polysilicon layer having phosphorus doped.

The CMOS peripheral circuit includes a nMOS transistor 45a and a pMOS transistor 45b. The nMOS transistor 45a of the CMOS has source/drain regions of the LDD structure formed of n− impurity region 31 of relatively low concentration and n+ impurity region 33 of relatively high concentration.

In the DRAM of such a structure, a feature of the present invention lies in that the impurity concentration of source/drain regions 18a and 19a of transfer gate transistor 10 of the memory cell is set to be lower than that of n+ impurity region 33 of nMOS transistor 45a of the peripheral circuit. For example, the impurity concentration of source/drain regions 18a and 19a of transfer gate transistor 10 is established to the level of $10^{17}/cm^3$–$10^{18}/cm^3$. The concentration of n− impurity region 31 of nMOS transistor 45a of the peripheral circuit is $10^{17}/cm^3$–$10^{18}/cm^3$, while the concentration of n+ impurity region 33 is set to $10^{19}/cm^3$–$10^{21}/cm^3$.

Figure 16F:
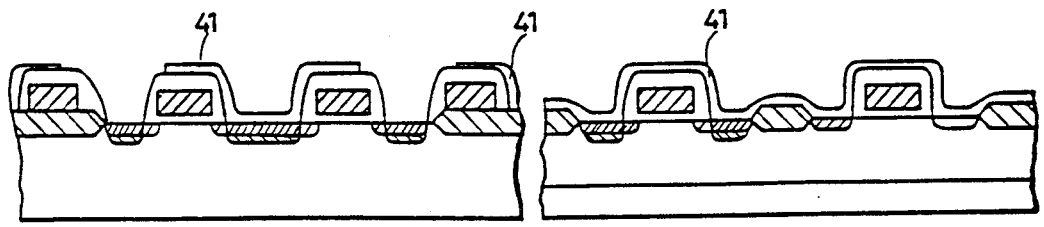
Figure 16G:
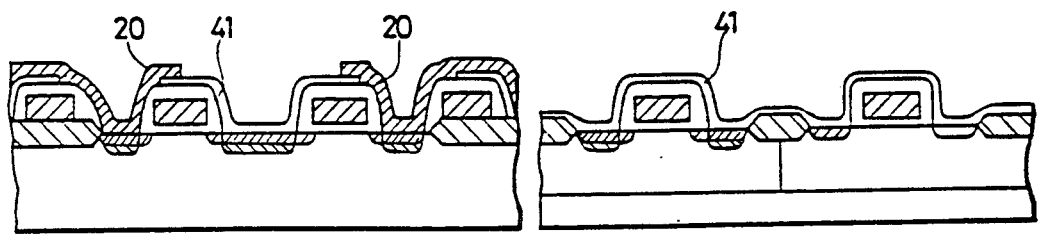
Figure 16H:
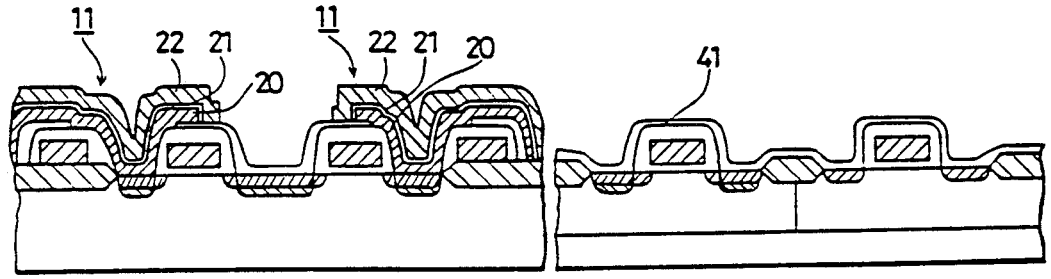
Figure 16I:
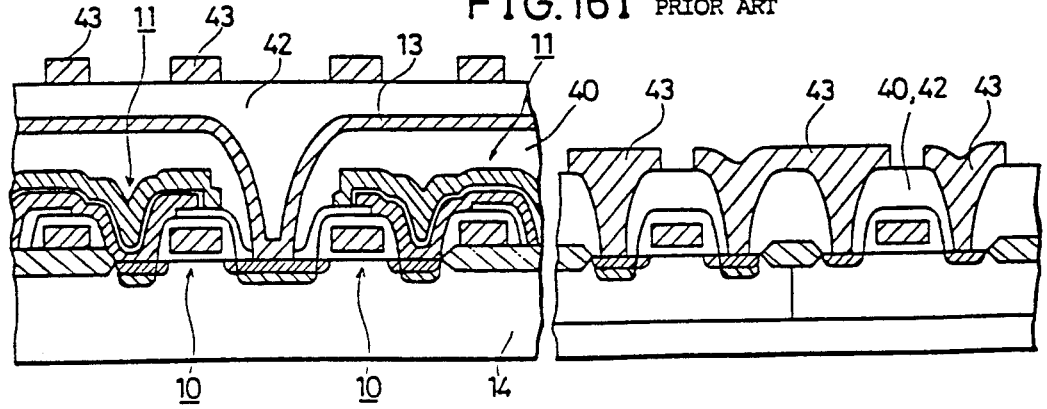
Figure 17:
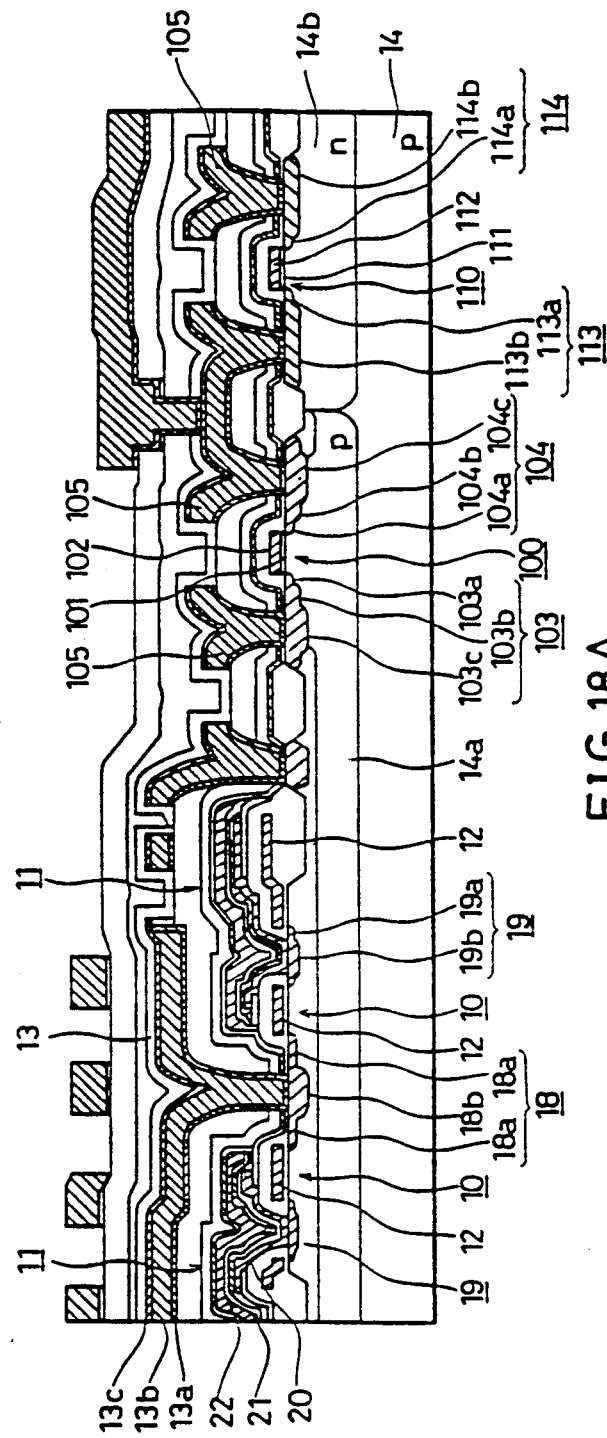
FIG. 17 is a sectional structure view of a second conventional DRAM.
Figure 18A:
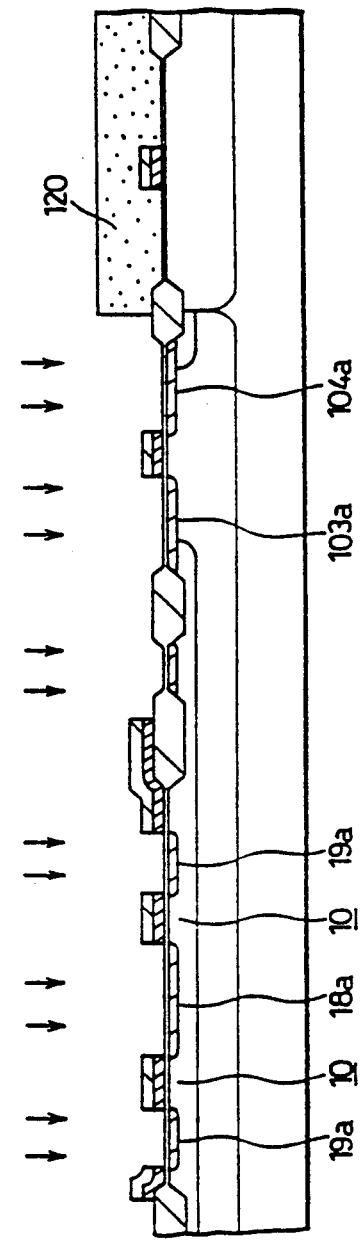

The manufacturing steps of the DRAM of the first embodiment will be explained with reference to FIGS. 2A–2I. Regarding this manufacturing step, the description of the manufacturing steps of FIGS. 2A–2B will be omitted because they are identical to those of FIGS. 16A–16B described in the section of the background art.

Figure 2A:
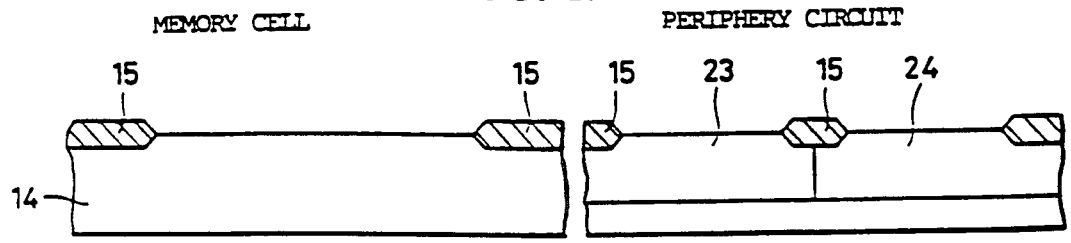
FIGS. 2A-2I are sectional views of the DRAM of FIG. 1 at different manufacturing steps thereof.
Figure 2B:
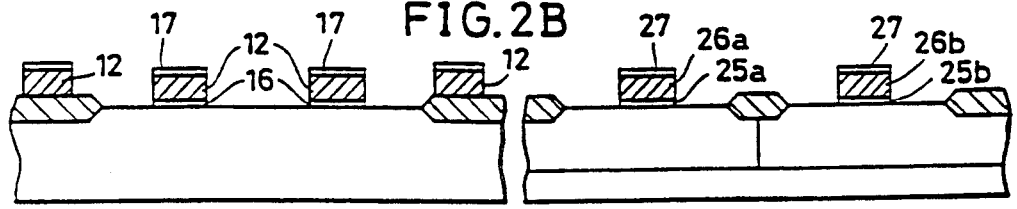
Figure 2C:
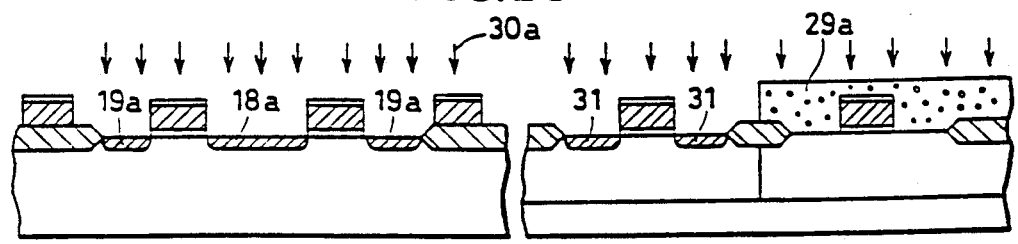

Referring to FIG. 2C, resist 29a covers the pMOS region of the peripheral circuit, followed by implanting onto the surface of the substrate phosphorus (P) ions or arsenic (As) ions 30a of low concentration at a dosage of $10^{13}/cm^2$–$10^{14}/cm^2$. This implantation step results in the formation of n− impurity regions 18a and 19a of transfer gate transistor 10 of the memory cell and n− impurity region 31 of the nMOS transistor of the peripheral circuit.

Figure 2D:
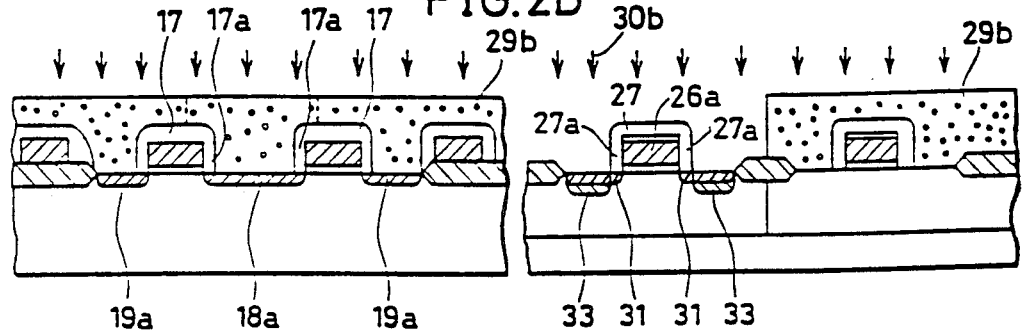

As shown in FIG. 2D, oxide film is deposited all over the substrate to be etched anisotropically. This forms sidewalls 17a and 27a of oxide film at the sidewalls of gate electrode 12 of transfer gate transistor and gate electrode 26a of the nMOS transistor of the peripheral circuit, After the memory cell region and the pMOS transistor region of the peripheral region is covered by resist 29b, n type impurity ions 30b such as arsenic or phosphorus are implanted onto the surface of the semiconductor substrate using sidewalls 27a of the nMOS transistor with a dosage of $10^{14}/cm^2$–$10^{16}/cm^2$ and implant energy of 50 keV. The n+ impurity regions 33 and 33 of the nMOS transistor of the peripheral circuit are formed by this ion implantation step. Thus, the LDD structure of the nMOS transistor of the peripheral circuit is formed.

Figure 2E:
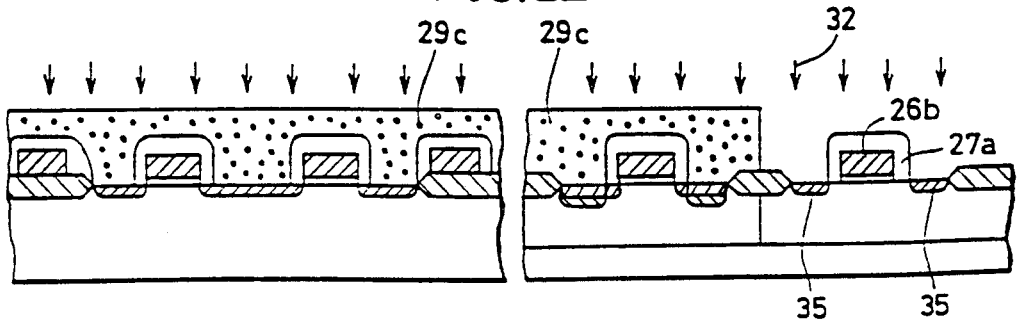
Figure 2F:
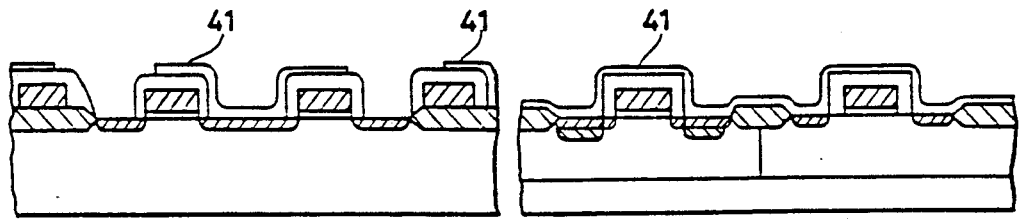

As shown in FIG. 2E, resist 29b is removed, followed by covering the surface of the memory cell and the nMOS transistor region of the peripheral circuit with resist 29c to implant p type impurity ions 32 such as boron (B, BF$_2$) onto the surface of the substrate through sidewall 27a of gate electrode 26b of the pMOS transistor at a dosage of $10^{14}$–$10^{15}/cm^2$ and implant energy of 30–40 keV. The p+ impurity regions 35 and 35 of the pMOS transistor are formed by this ion implantation step. Thus, the pMOS transistor of the peripheral circuit is formed.

The manufacturing steps of capacitor 11 of the memory cell will be explained hereinafter. The descriptions of FIGS. 2F–2I are identical to that of FIGS. 16F–16I explained in the section of the background art. Therefore the descriptions thereof will be omitted.

Low concentration source/drain regions 18a and 19a of transfer gate transistor 10 featuring the present invention are implemented by carrying out high concentration impurity ion implantation of the peripheral circuit after the memory cell region is covered by resist 29b, as shown in FIG. 2D. It is therefore possible to form source/drain regions 18a and 19a of transfer gate transistor 10 without increasing manufacturing steps compared to that of the conventional manufacturing method. Because source/drain regions 18a and 19a of transfer gate transistor 10 do not suffer the damage by high concentration ion implantation, the formation of many crystal deficiencies on the surface of semiconductor substrate 14 can be avoided. It is therefore possible to suppress leakage of signal charge from capacitor 11 formed above the surface of source/drain region 19a to a minimum value. Reliability in operation rather than high speed operation characteristic is required for the transfer gate transistor 10 of the memory cell. The performance requirements can be satisfied even when source/drain regions 18a and 19a are formed of low concentration impurity regions. Applicants have confirmed that the existence of high concentration impurity region 19b in source/drain region 19 of the transfer gate transistor connected to the side of the capacitor does not have a great influence on the operation of the memory. More specifically, impurities included in lower electrode 20 of the capacitor and bit line 13 are diffused, by the heating process of manufacturing, to form impurity regions 18b and 19b of high concentration inside source/drain regions 18a and 19a of low concentration. Impurity regions 18b and 19b of high concentration are maintained within source/drain regions 18a and 19a of low concentration. This will be described in detail below.

Figure 2G:
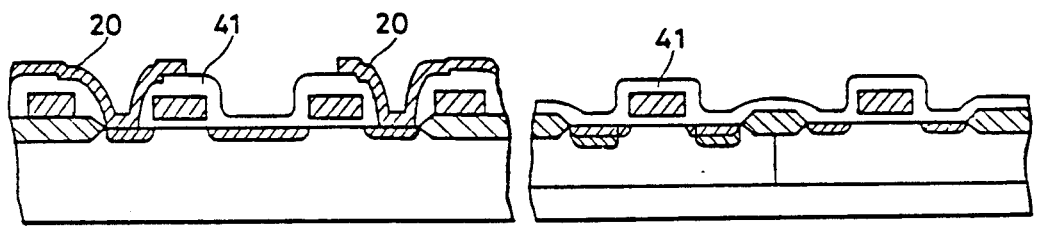
Figure 2H:
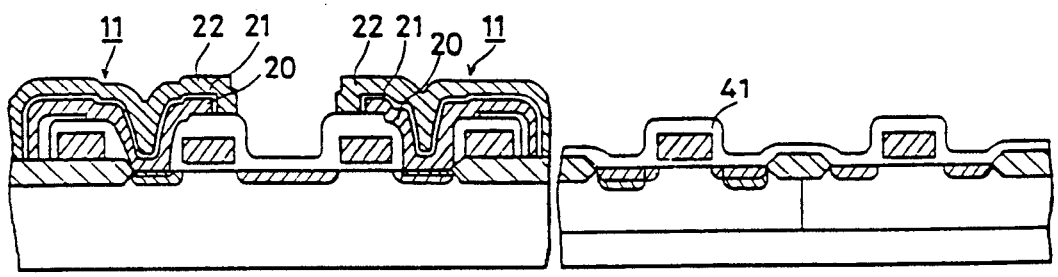
Figure 2I:
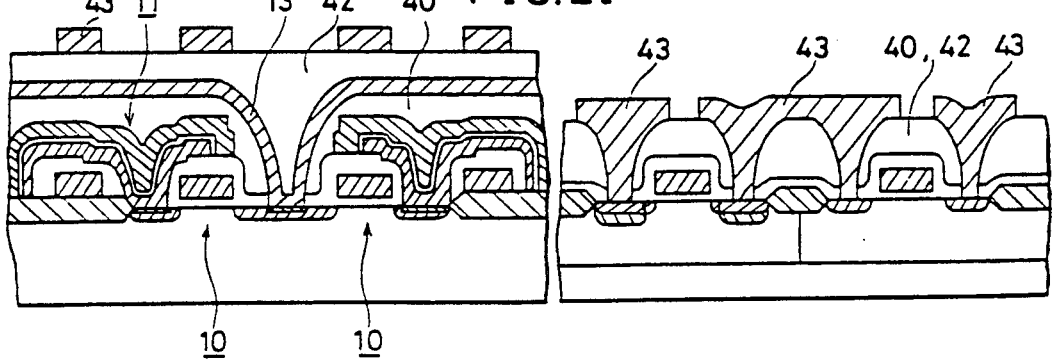

Referring to the above-mentioned FIGS. 2H and 2I, several heating processes are carried out after the formation of impurity regions 18a and 19a of low concentration. For example, the heating process after implanting impurities into lower electrode 20 of capacitor 11 and cell plate 22, and the heating process after the formation of interlayer insulating layers 40 and 42 are carried out. These heating processes cause impurities included in lower electrode 20 of the capacitor and bit line 13 to be automatically diffused into silicon substrate 14.

FIG. 9 is a concentration profile obtained by simulation of the impurity region formed automatically by thermal diffusion. The ordinate of FIG. 9 indicates the impurity concentration, and the abscissa indicates the depth from the surface of the silicon substrate. This simulation is obtained when there is arsenic of $1 \times 10^{20}$/cm$^3$ in lower electrode 20 of capacitor 11 and subjected to heating process for 2-3 hours at a temperature of 900° C., for example. The heating time period corresponds to the heating process time period carried out at the manufacturing step indicated in FIGS. 2H to 2I. It can be seen that curve A of phosphorus (P), which corresponds to n− impurity regions 18a and 19a of low concentration, indicates the achievement of a deeper location from the surface of the substrate in comparison with curve B of arsenic concentration distribution. It is obvious from the result of FIG. 9 that n+ impurity regions 18b and 19b of high concentration are maintained within n− impurity regions 18a and 19a of low concentration. The refresh characteristic of the memory cell can be improved by suppressing leakage current from capacitor 11. This will be explained with reference to FIG. 12.

Figure 12:
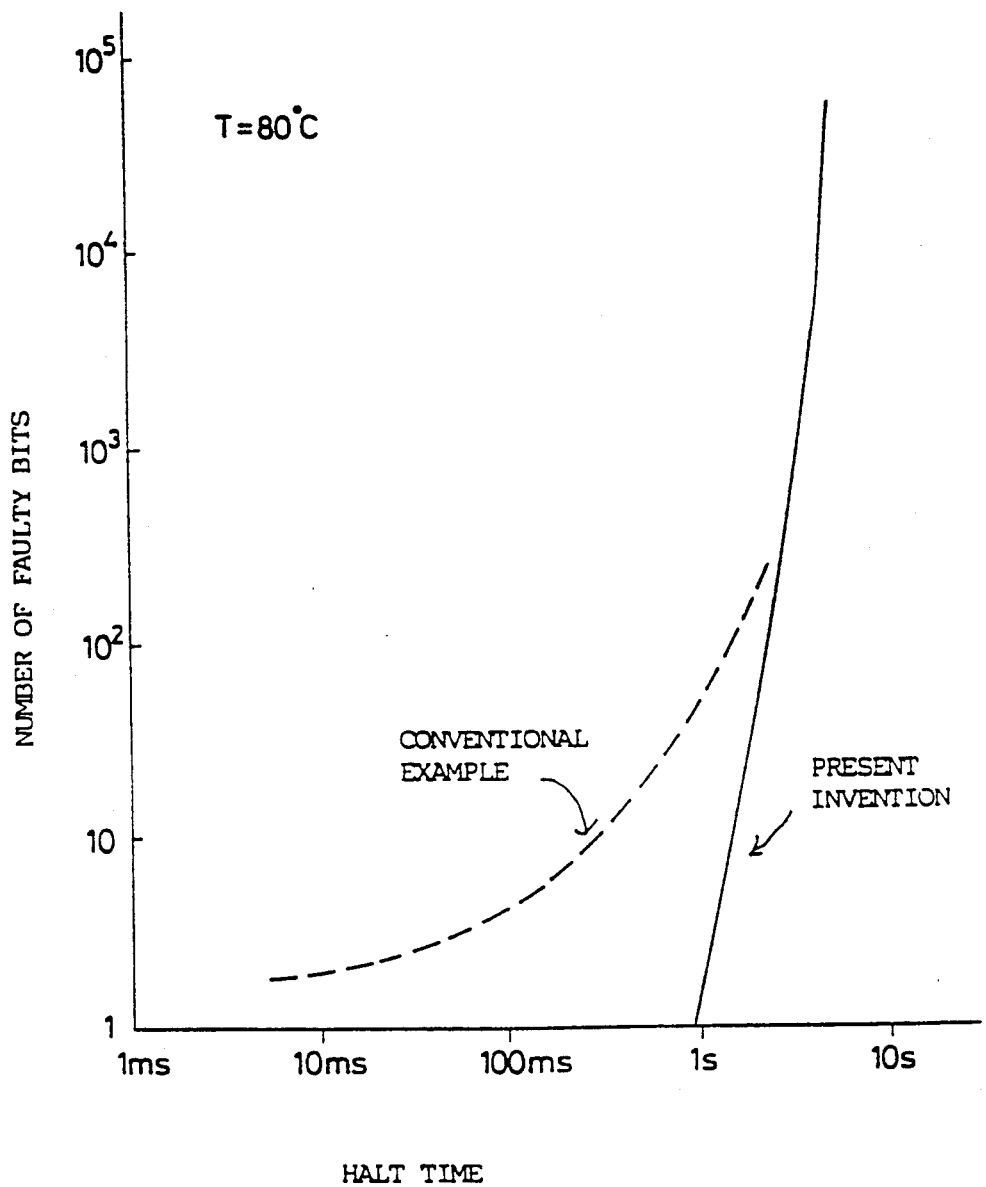
FIG. 12 is a diagram showing the relation of the signal charge hold time of the memory cell to the occurrence number of faulty bits.
Figure 13:
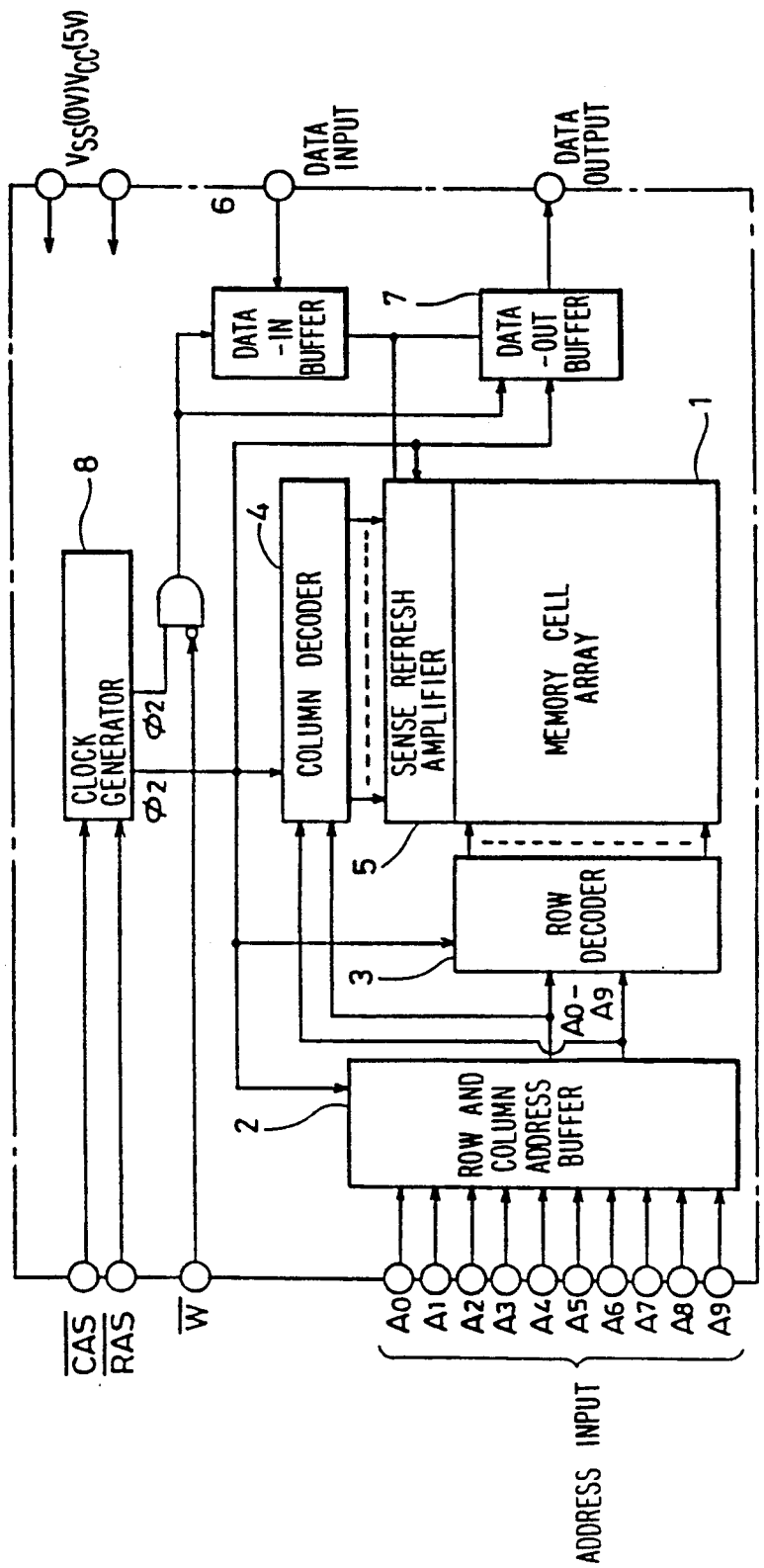
FIG. 13 is a block diagram for explaining the structure of a DRAM.
Figure 14:
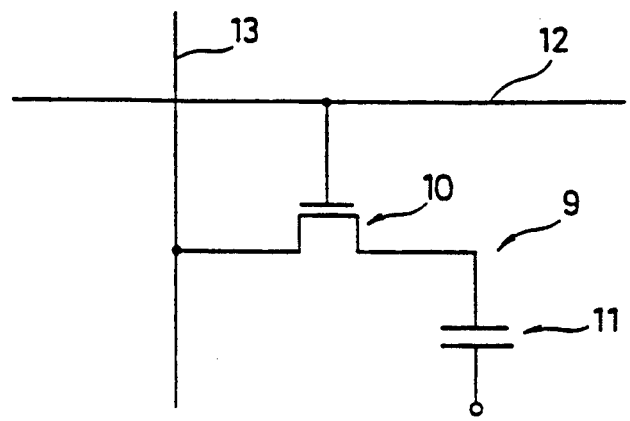
FIG. 14 is a equivalent circuit diagram of a general DRAM memory cell 1.
Figure 15:
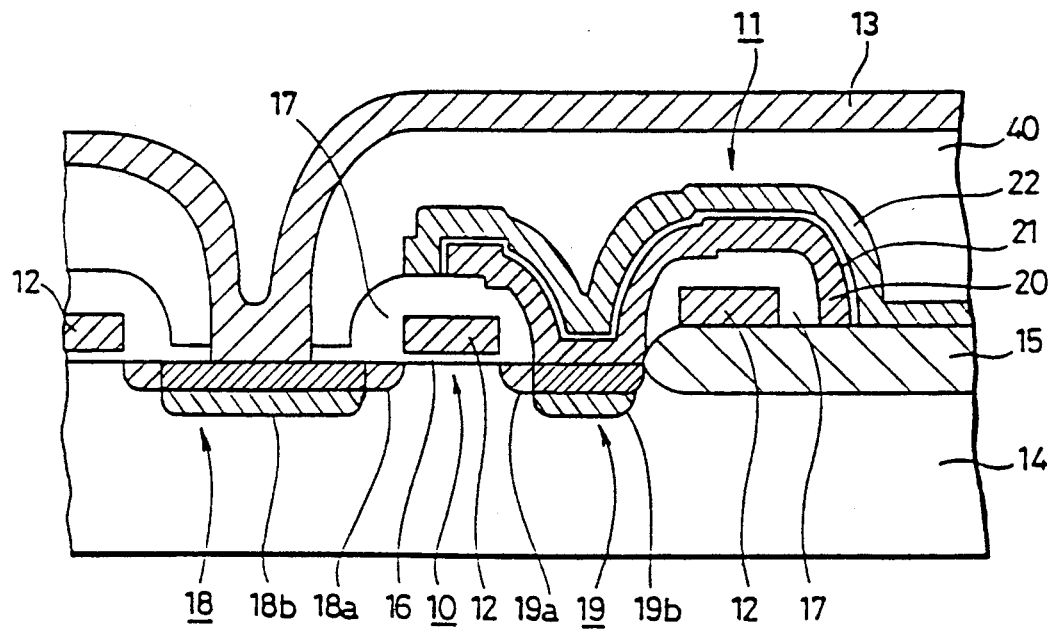
FIG. 15 is a sectional structure view of a conventional DRAM memory cell.

The abscissa of FIG. 12 indicates the operation halt time after writing operation of data into the capacitor of the memory cell. The ordinate indicates the number of the faulty bits in which erroneous readout occurs when data is read out from the memory cell after the halt time indicated by the abscissa. This experiment was carried out under a temperature of 80° C. As shown in FIG. 12, the halt time till the heavy occurrence of faulty bits of the DRAM comprising the memory cell of the present invention is longer than that of a conventional one, and the faulty bits are distributed in concentration. It is therefore possible to extend the refresh interval of the refresh operation of the memory cell to improve the refresh characteristic.

A second embodiment of the present invention will be explained hereinafter with reference to FIG. 3. In the second embodiment, barrier metal layers 28 and 13b such as of TiN or TiW are formed under lower electrode 20 of capacitor 11 and under bit line 13 of the memory cell. These barrier metal layers 28 and 13b can prevent impurities included in lower electrode 20 of the capacitor and in polysilicon layer 13a of the bit line from diffusing to the surface of silicon substrate 14 under the high temperature during the manufacturing steps of the memory cell. It is therefore possible to implement source/drain regions 18 and 19 of transfer gate transistor 10 only with n− impurity regions 18a and 19a of low concentration.

FIG. 4A is a sectional view showing the formation step of barrier metal layer 28 and lower electrode 20 of the capacitor, corresponding to the steps of FIG. 2G of the first embodiment. Barrier metal layer 28 is formed on the surface of the silicon substrate by sputtering method or the like, with a polysilicon layer including impurities formed on the surface thereof. Both of these are patterned to form barrier metal layer 28 and lower electrode 20 of the capacitor.

FIG. 4B is a sectional view showing the formation step of barrier metal layer 13b, corresponding to the step of FIG. 2H of the first embodiment. That is to say, barrier metal layer 13b is formed on the surface of interlayer insulating layer 40 by sputtering method or the like, with polysilicon layer 13a formed on the surface thereof. Both of these are patterned to form bit line 13.

Figure 5:
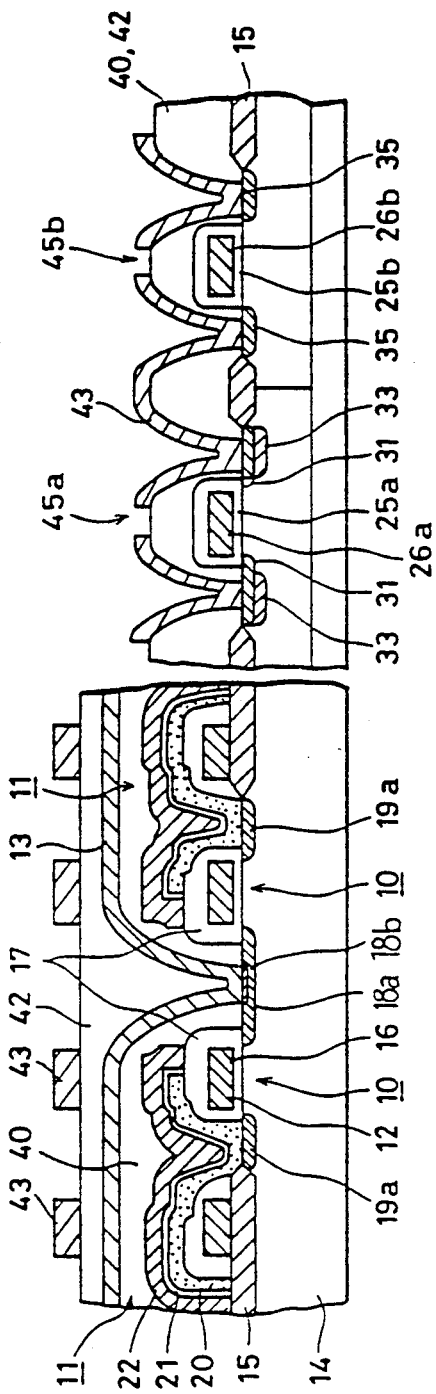
FIG. 5 is a sectional structure view of a DRPM of a third embodiment of the present invention.

A third embodiment of the present invention will be explained hereinafter with reference to FIG. 5. In the third embodiment, lower electrode 20 of the memory cell capacitor 11 is formed of a metallic layer such as WSi, MoSi, W, Mo, Ti and TiW not including impurities, a metallic alloy layer, or a compound of metal and silicon. By forming lower electrode 20 of the capacitor with metallic layer or the like, diffusion of impurities into source/drain region 19 of transfer gate transistor 10 due to effect of heat during the manufacturing step can be prevented. For a similar reason, bit line 13 may be formed of a metallic layer, a metallic alloy layer, or a compound of metal and silicon.

Figure 6:
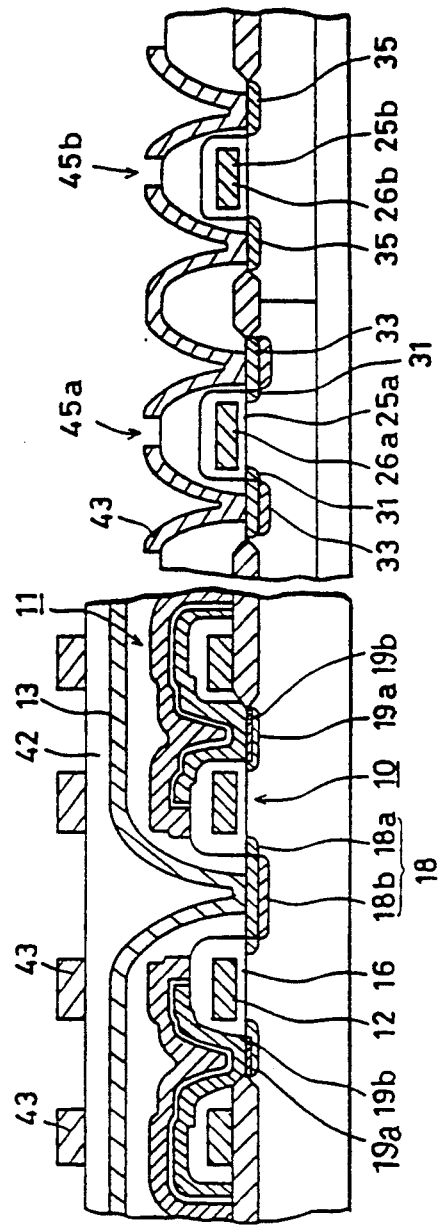
FIG. 6 is a sectional structure view of a DRAM of a fourth embodiment of the present invention.

A fourth embodiment of the present invention will be explained with reference to FIG. 6. In comparison with the first embodiment, the memory cell of the fourth embodiment with the source/drain region pair of transfer gate transistor 10 has the impurity region of the side connected to the capacitor 11 constituted only by n− impurity region 19a of low concentration, and the source/drain region of the side connected to bit line 13 constituted by the LDD structure. Because impurity region 19a connected to lower electrode 20 of capacitor 11 has the high concentration ion implantation step omitted, the effect of suppressing leakage currents from capacitor 11 is also obtained in this embodiment. The method of manufacturing source/drain region 18 of the LDD structure is achieved by forming a pattern of opening in resist 29b covering the memory cell region above n− impurity region 18a to be connected to bit line 13, as shown in FIG. 7 in the manufacturing step corresponding to FIG. 2D of the first embodiment.

As a modification of the fourth embodiment, the LDD structure of source/drain region 18 of the side connected to bit line 13 of transfer gate transistor 10 may be implemented by heat diffusion of impurities in bit line 13. In this case, the approach of differentiating the types of impurities to be included in bit line 13 and lower electrode 20 of capacitor 11, or the approach of differentiating the concentrations may be taken, so that impurities do not diffuse into source/drain region 19 of the side connected to capacitor 11 of transfer gate transistor 10. For example, arsenic is introduced into lower electrode 20 of capacitor 11, whereas phosphorus is introduced into bit line 13. Phosphorus has a larger heat diffusion coefficient compared with that of arsenic in this case. When submitted to similar heat processing, the diffusion of phosphorus to the substrate from bit line 13 is greater than the diffusion of arsenic into the substrate from lower electrode 20. By setting appropriate heat processing conditions, it is possible to form the LDD structure only in source/drain region 18 of the side connected to the bit line. At this time, the source/drain region 19 of the side connected to capacitor 11 is formed so as to include diffusion region having arsenic of high concentration within n− impurity region 19a of low concentration.

When the impurity concentration of bit line 13 differs from that of lower electrode 20 of capacitor 11, for example, when the concentration of phosphorus in bit line is $10^{22}$/cm$^3$, and that of lower electrode 20 of capacitor 11 is $2 \times 10^{18}$–$2 \times 10^{20}$, cm$^3$, phosphorus of the bit line diffuses further into the substrate compared to phosphorus of lower electrode 20.

Another modification of the fourth embodiment of the present invention will be explained hereinafter with reference to FIG. 8. In the modification of FIG. 8, barrier metal layer 28 is formed only beneath lower electrode 20 of capacitor 11. This barrier metal layer 28 prevents impurities in lower electrode 20 of capacitor 11 to diffuse into the substrate. Impurities only from the side of bit line 13 diffuse into the substrate, resulting in implementation of the LDD structure only in the source/drain region 8 of the side connected to bit line 13.

Figure 10:
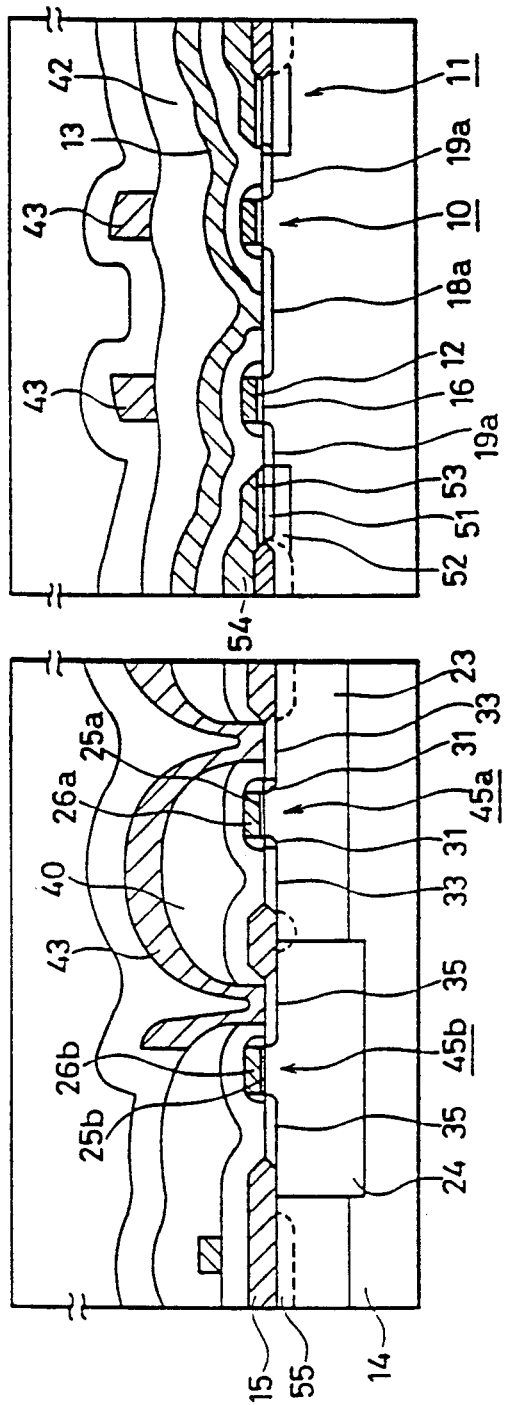
FIG. 10 is a sectional structure view of a DRAM having a capacitor of planar type according to a sixth embodiment of the present invention.

A fifth embodiment of the present invention will be explained hereinafter with reference to FIG. 10. This DRAM comprises the so-called planar type capacitor as capacitor 11. On the surface of semiconductor substrate 14, n type impurity region 51 connected to one impurity region 19a of transfer gate 10 is formed. A dielectric film 53 and an upper electrode 54 are stacked on the surface of n type impurity region 51. In the lower region of n type impurity region 51, a p+ impurity region 52 is formed having a conductivity type identical to that of the substrate. Such a structure is referred to as Hi-C structure, attempting to increase junction capacitance between n type impurity region 51 and p+ impurity region to increase the capacitor capacitance. The source/drain region of transfer gate transistor 10 is constituted only by n-impurity regions 18a and 19a of low concentration. In other words, the high concentration impurity ion implantation step is omitted, as will be explained in the following manufacturing steps. A CMOS circuit is indicated in the peripheral circuit, similar to that of the first to third embodiments, wherein the source/drain region of the nMOS transistor 45a comprises the so-called LDD structure.

The manufacturing steps of the DRAM of the above mentioned sixth embodiment will be explained hereinafter with reference to FIGS. 11A–11J.

Figure 11A:
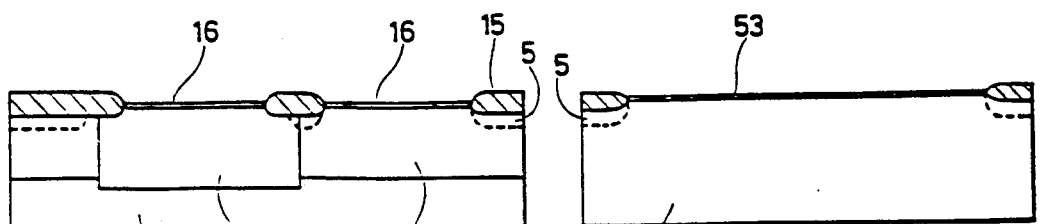

As shown in FIG. 11A, a thick field oxide film 15 is formed at a predetermined region on the main surface of p type silicon substrate 14, with a p+ channel stopper 55 formed beneath thereof. In the peripheral circuit region, a p well 23 and a n well 24 are formed in p type silicon substrate 14. On the surface of p type silicon substrate, oxide films 16 and 53 are formed.

Figure 11B:
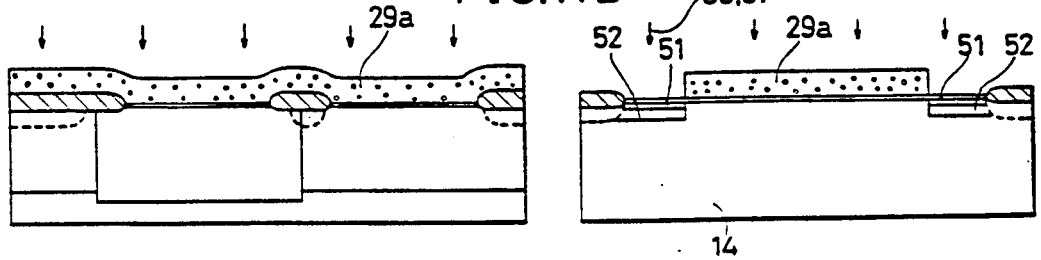

Referring to FIG. 11B, the surface of p type silicon substrate 14 is covered by resist 29a, followed by patterning to open only the capacitor formation region of the memory cell. Using this patterned resist 29a as a mask, arsenic ions 56 and boron (B) ions 57 are implanted onto the surface of p type silicon substrate 14 for activation. Arsenic ions 56 are implanted under implant energy of 100–200 keV and dosage of $10^{14}$–$10^{15}$/cm$^2$, whereas boron ions 57 are implanted under energy of 100–200 keV and a dosage of $10^{12}$–$10^{13}$/cm$^2$. This results in the formation of Hi-C structure constituted by n type impurity region 51 of capacitor 11 and p+ impurity region 52.

Figure 11C:
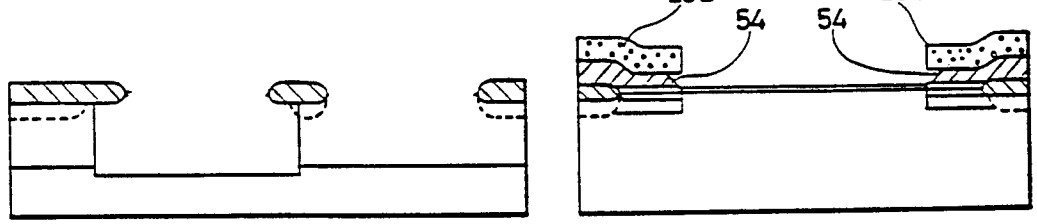

Referring to FIG. 11C, resist 29a is removed, followed by formation of a polysilicon layer including impurities and resist 29b to be patterned to a predetermined shape. This forms upper electrode 54 above the capacitor.

Figure 11D:
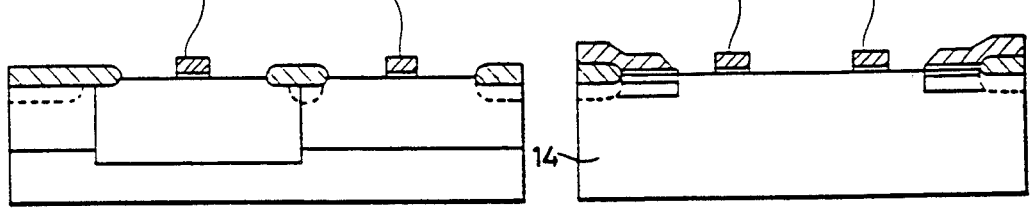

As shown in FIG. 11D, a polysilicon layer having conductivity is deposited over p type silicon substrate 14 to be patterned to a predetermined configuration. This forms gate electrodes 12 and 12 of the transfer gate transistor of the memory cell, and gate electrodes 26a and 26b of the nMOS transistor and pMOS transistor of the peripheral circuit.

Figure 11E:
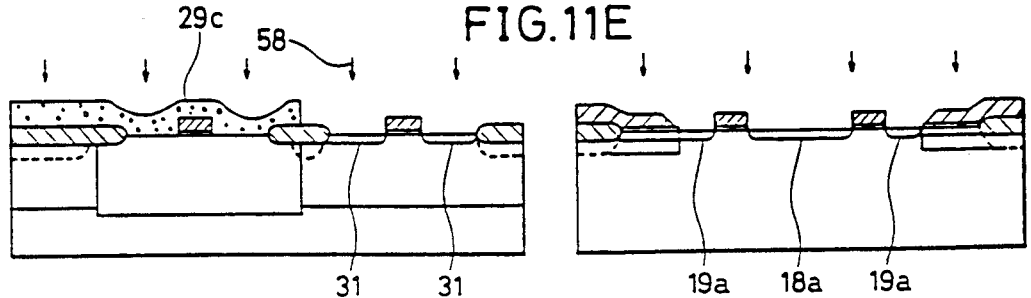

Referring to FIG. 11E, the surface of the pMOS region is covered by resist 29c, followed by ion implantation of phosphorus ions 58, to form n⁻ impurity regions 18a and 19a of low concentration of the transfer gate transistor and n⁻ impurity regions 31 and 31 of low concentration of the nMOS transistor.

Referring to FIG. 11F, resist 29c is removed, followed by deposition of the oxide film and anisotropically etching to form sidewalls 59 of oxide film at the sides of gate electrode 12 of the transfer gate transistor and gate electrodes 26a and 26b of the pMOS transistor and nMOS transistor. Resist 29d is then applied all over to open only the nMOS transistor formation region. Using gate electrode 26a of the nMOS transistor and sidewalls 59 as a mask, arsenic ions 60 are implanted onto the surface of p type silicon substrate 14. This forms n+ impurity region 33 and 33 of high concentration of the nMOS transistor.

As shown in FIG. 11G, resist 29d is removed, j followed by the appliance of resist 29e all over to open only the pMOS transistor formation region. Then, p type impurity ions 61 are implanted to form p+ impurity regions 35 and 35 of the pMOS transistor.

Referring to FIG. 11H, resist 29e is removed, and an interlayer insulating layer 62 of oxide film is deposited on the surface of p type silicon substrate 14 using CVD method. A contact hole 63 for bit line contact is formed in interlayer insulating film 62 of the memory cell region.

Referring to FIG. 11I, bit line 13 is formed constituted by polysilicon, for example. A second interlayer insulating film 42 is coated over the bit line.

Referring to FIG. 11J, a predetermined contact hole is formed in the interlayer insulating layer 42 of the peripheral circuit region, followed by formation of wiring layer 43.

Thus, a DRAM can be manufactured having a structure wherein the source/drain region of the transfer gate transistor of the memory cell is constituted only by n⁻ impurity regions 18a and 19a of low concentration.

The present invention is provided taking notice of the fact that leakage of signal charge from the capacitor of the memory cell of the DRAM is induced by crystal deficiency of the impurity region connected to the lower electrode of the capacitor. This problem of leakage is solved by omitting the high concentration impurity ion implantation liable to generate crystal deficiency in the substrate. With such a method, the leakage of signal charge from the capacitor is suppressed.

Another important concept of the present invention is that the source/drain region 19 of the side connected to the capacitor of the transfer gate transistor is substantially constructed only by impurity region of low concentration. There is no intention of formation of high concentration impurity region in the source/drain region.

Because the semiconductor device of the present invention comprises a peripheral circuit with a transistor of the LDD structure and a memory cell section constructed so as to allow omission of high concentration ion implantation only at the connecting region with the capacitor, the generation of crystal deficiencies inducing refresh degradation is suppressed. This allows stable manufacturing of memory cells having high reliability and satisfactory refresh characteristic. The method of manufacturing thereof can be carried out under a simple method without adding new steps to the conventional manufacturing steps.

Although the present invention has been described and illustrated in detail, it is clearly understood that the same is by way of illustration and example only and is not to be taken by way of limitation, the spirit and scope of the present invention being limited only by the terms of the appended claims

What is claimed is:

1. A dynamic random access memory (DRAM) comprising;

a memory cell array formed on a semiconductor substrate having a plurality of memory cells each for storing a unit of information, each said memory cell being located in the vicinity of an intersection of one of a plurality of word lines extending over a main surface of said semiconductor substrate and one of a plurality of bit liens extending in a direction crossing the word lines, wherein each said memory cell includes
- (i) a transfer gate transistor having a first impurity region formed in said semiconductor substrate and connected to said bit line, a gate electrode connected to said word line, and a second impurity region a poriton of which has a predetermined impurity concentration formed in said semiconductor substrate, and
- (ii) a capacitor connected to the second impurity region of said transfer gate transistor; and a peripheral circuit for writing or reading information to or from the memory cell array, wherein said peripheral circuit includes a transistor of a conductivity type identical to that of said transfer gate transistor, having a pair of impurity regions constituted by a region of relatively high concentration and a region of a relatively low concentration formed in the main surface of said semiconductor substrate, and a gate electrode formed on the main surface of said semiconductor substrate with an insulating film therebetween, wherein the predetermined impurity concentration of said portion of the second impurity region is substantially equal to the impurity concentration of the region of relatively low concentration of the peripheral circuit transistor, wherein said second impurity region is devoid of high concentration extending beyond said portion in any direction.

2. The DRAM according to claim 1, wherein said first impurity region and said second impurity region consist of a region having an impurity concentration set substantially equal to that of the impurity region of relatively low concentration of said transistor of said peripheral circuit.

3. The DRAM according to claim 2, having a barrier metal layer between said bit line and said first impurity region of said transfer gate transistor wherein each said capacitor comprises:
- a lower electrode electrically connected to said second impurity region of said transfer gate transistor, one end extending over said gate electrode of said transfer gate transistor;
- a dielectric layer formed on the surface of the lower electrode; 'an upper electrode formed on the surface of the dielectric layer; and
- a barrier metal layer between said lower electrode and said second impurity region of said transfer gate transistor.

4. The DRAM of claim 1, wherein he second impurity region of said transfer gage transistor of said memory cell comprises:
- (a) an inner region having an impurity concentration higher than that of the region of relatively low concentration of the peripheral circuit transistor, and
- (b) an outer region, surrounding said inner region, completely having an impurity concentration substantially equal to that of the region of relatively low concentration of the peripheral circuit transistor.

5. The DRAM according to claim 3, wherein said first impurity region connected to said bit line comprises a third region having an impurity concentration substantially equal to that of the impurity region of relatively low concentration of said transistor of said peripheral circuit, and a fourth region having an impurity concentration higher than that of said third region.

6. The DRAM according to claim 1, wherein said capacitor comprises:
- a lower electrode electrically connected to said second impurity region of said transfer gate transistor, one end extending over said gate electrode of said transfer gate transistor;
- a dielectric layer formed on the surface of the lower electrode;
- an upper electrode formed on the surface of the dielectric layer; and
- a barrier metal layer between said lower electrode and said second impurity region of said transfer gate transistor.

7. The DRAM according to claim 6, wherein said barrier metal layer comprises either high refractory metal or high refractory metal silicide.

8. A dynamic random access memory (DRAM) comprising:

a memory cell array formed on a semiconductor substrate having a plurality of memory cells each for storing a unit of information, each said memory cell being located in the vicinity of an intersection of one of a plurality of word lines extending over a main surface of said semiconductor substrate and one of a plurality of bit lines extending in a direction crossing the word lines, wherein each said memory cell includes
- (i) a transfer gate transistor having a first impurity region formed in said semiconductor substrate and connected to said bit line, a gate electrode connected to said word line, and a second impurity region formed in said semiconductor substrate, and
- (ii) a capacitor connected to the second impurity region of said transfer gate transistor; and a peripheral circuit for writing or reading information to or from the memory cell array, wherein said peripheral circuit includes a transistor of a conductivity type identical to that of said transfer gate transistor, having a pair of impurity regions constituted by a region of relatively high concentration and a region of a relatively low concentration formed in the main surface of said semiconductor substrate, and a gate electrode formed on the main surface of said semiconductor substrate with an insulating film therebetween, wherein the second impurity region of said transfer gate transistor of said memory cell comprises
- (a) an inner region having an impurity concentration higher than that of the region of relatively low concentration of the peripheral circuit transistor, and
- (b) an outer region extending beyond and entirely containing said inner region, said outer region having an impurity concentration substantially equal to that of the region of relatively low concentration of the peripheral circuit transistor.

9. The DRAM according to claim 8, wherein said first impurity region comprises an outer region having an impurity concentration set substantially equal to that of the impurity region of relatively low concentration of said transistor of said peripheral circuit, and an inner region formed inside said outer region and having an impurity concentration higher than that of said outer region.

10. The DRAM according to claim 8, wherein said first impurity region connected to said bit line comprises a third region having an impurity concentration substantially equal to that of the impurity region of relatively low concentration of said transistor of said peripheral circuit, and a fourth region formed extending in a position deeper than said third region from the surface of said semiconductor substrate and having a concentration higher than that of said third region.

11. The DRAM according to claim 1, wherein said first impurity region and said second impurity region each include only an impurity concentration substantially equal to that of the impurity region of relatively low concentration of said transistor of said peripheral circuit.

12. The DRAM according to claim 1, wherein the region of relatively high concentration of the peripheral circuit transistor extends beyond the region of relatively low concentration of the transistor of said peripheral circuit.

* * * * *